US008766329B2

(12) United States Patent
Endo et al.

(10) Patent No.: US 8,766,329 B2
(45) Date of Patent: Jul. 1, 2014

(54) SEMICONDUCTOR DEVICE AND A METHOD FOR MANUFACTURING THE SAME

(75) Inventors: Yuta Endo, Kanagawa (JP); Yuki Imoto, Kanagawa (JP); Yuko Takabayashi, Kanagawa (JP); Yasumasa Yamane, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/523,262

(22) Filed: Jun. 14, 2012

(65) Prior Publication Data
US 2012/0319175 A1     Dec. 20, 2012

(30) Foreign Application Priority Data
Jun. 16, 2011 (JP) .................................. 2011-134056

(51) Int. Cl.
*H01L 27/085*     (2006.01)

(52) U.S. Cl.
USPC ............. 257/255; 257/E21.409; 257/E29.255

(58) Field of Classification Search
USPC ........................... 257/255, E21.409, E29.255
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Kmizuka et al.,"Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System", Journal of Solid State Chemistry, vol. 116, 1995, pp. 170-178.

(Continued)

*Primary Examiner* — Timor Karimy
(74) *Attorney, Agent, or Firm* — Husch Blackwell LLP

(57) ABSTRACT

A transistor in which an electron state at an interface between an oxide semiconductor film and an underlayer film in contact with the oxide semiconductor film is favorable is provided. A value obtained by dividing a difference between nearest neighbor interatomic distance of the underlayer film within the interface and a lattice constant of the semiconductor film by the nearest neighbor interatomic distance of the underlayer film within the interface is less than or equal to 0.15. For example, an oxide semiconductor film is deposited over an underlayer film which contains stabilized zirconia which has a cubic crystal structure and has the (111) plane orientation, whereby the oxide semiconductor film including a crystal region having a high degree of crystallization can be provided directly on the underlayer film.

15 Claims, 29 Drawing Sheets

(56) References Cited

U.S. PATENT DOCUMENTS

| | | | |
|---|---|---|---|
| 6,563,174 B2 | 5/2003 | Kawasaki et al. | |
| 6,664,565 B1* | 12/2003 | Sano et al. | 257/43 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,134,156 B2 | 3/2012 | Akimoto | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0145182 A1* | 7/2006 | Fujioka et al. | 257/103 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1* | 11/2007 | Kim et al. | 257/43 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0320459 A1* | 12/2010 | Umeda et al. | 257/43 |
| 2011/0217815 A1 | 9/2011 | Honda et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 6-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-96055 | 4/2007 |
| JP | 2007-123861 | 5/2007 |
| JP | 2011-205089 | 10/2011 |
| WO | WO-2004/114391 | 12/2004 |

OTHER PUBLICATIONS

Nakamura et al.,"The Phase Relations in the $In_2O_3$-$Ga_2ZnO_4$-ZnO System at 1350° C", Journal of Solid State Chemistry,vol. 93, 1991, pp. 298-315.

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plasitc Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZNO TFT,", IMID '07 Digest, 2007, pp. 1249-1252.
Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.
Osada.T et al., "Development of Driver-Integrated Panel Using Amorphous In-Ga-Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic NANO-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.

(56) References Cited

OTHER PUBLICATIONS

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

- In
- Sn
- Zn
- O

- In
- Ga
- Zn
- O

- In
- Ga or Zn
- O

- In
- Ga
- Zn
- O

SEMICONDUCTOR DEVICE AND A METHOD FOR MANUFACTURING THE SAME

BACKGROUND OF THE INVENTION

1. Field of the Invention

The present invention relates to a semiconductor device which includes a circuit including a semiconductor element such as a transistor. For example, the present invention relates to a power device which is mounted on a power supply circuit; a semiconductor integrated circuit including a memory, a thyristor, a converter, an image sensor, or the like; and an electro-optical device typified by a liquid crystal display panel; a light-emitting display device including a light-emitting element; and an electronic device including any of the above as a component.

In this specification, a semiconductor device generally refers to a device which can function by utilizing semiconductor characteristics; an electro-optical device, a light-emitting display device, a semiconductor circuit, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although transistors including amorphous silicon have low field-effect mobility, they can be formed over a larger glass substrate. On the other hand, although transistors including polycrystalline silicon have high field-effect mobility, they are not suitable for being formed over a larger glass substrate.

Other than a transistor formed using silicon, a technique in which a transistor is formed using an oxide semiconductor and applied to an electronic device or an optical device has attracted attention. For example, a technique of manufacturing a transistor by using zinc oxide or In—Ga—Zn—O-based oxide as oxide semiconductor, and of using the transistor for a switching element of a pixel of a display device and the like is disclosed in Patent Document 1 and Patent Document 2.

The lattice constant of $InGaO_3(ZnO)_m$ (m is a natural number) having a homologous phase is disclosed in Non-Patent Document 1.

REFERENCE

[Patent Document 1] Japanese Published Patent Application No. 2007-123861

[Patent Document 2] Japanese Published Patent Application No. 2007-096055

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, Vol. 93, 1991, pp. 298-315.

SUMMARY OF THE INVENTION

Electric characteristics of a transistor are affected by an electron state at an interface between an oxide semiconductor film and an underlayer film or a gate insulating film which is in contact with the oxide semiconductor film. When the interface between the oxide semiconductor film and the underlayer film or the gate insulating film which is in contact with the oxide semiconductor film is disordered during the manufacturing of the transistor or after manufacture of the transistor, the density of states of defects at the interface is high, and thus electric characteristics of the transistor are likely to be unstable.

In view of such problems, an object of one embodiment of the present invention is to provide a semiconductor device including a transistor in which an electron state at an interface between an oxide semiconductor film and an underlayer film or a gate insulating film which is in contact with the oxide semiconductor film is favorable.

Further, an object of one embodiment of the present invention is to manufacture a highly reliable semiconductor device by giving stable electric characteristics to a transistor in which an oxide semiconductor film is used for a channel.

In a channel region of the transistor, an oxide semiconductor film which includes two or more crystal portions is provided directly on the underlayer, film. The crystal portions of the oxide semiconductor film are different from each other in a direction of a-axis, and the crystal portions are c-axis aligned with respect to the underlayer film and have at least a triangle or hexagonal atomic arrangement when seen from a direction perpendicular to the a-b plane, the top surface, or the interface.

The underlayer film has an atomic arrangement similar to that of the oxide semiconductor film at an interface between the oxide semiconductor film and the underlayer film, and the lattice mismatch factor of the atomic arrangement between the underlayer film and the oxide semiconductor film is less than or equal to 0.15, preferably less than or equal to 0.12, more preferably less than or equal to 0.10, and still more preferably less than or equal to 0.08. Note that a lattice mismatch factor of an atomic arrangement refers to a value obtained by dividing a difference in nearest neighbor interatomic distance between a lower layer and a upper layer within a plane where the lower layer and the upper layer are in contact with each other by the nearest neighbor interatomic distance of the lower layer within the plane.

For example, the underlayer film has a triangle atomic arrangement, the crystal included in the oxide semiconductor has a triangle atomic arrangement, and each interatomic distance (corresponding to the length of one side of a triangle formed by atoms) may be within the above range of the lattice mismatch factor.

For example, the underlayer film contains zirconium oxide. When zirconium oxide contains a stabilizing material such as yttrium oxide, the zirconium has a cubic crystal structure and has the (111) plane alignment. Note that the zirconium oxide containing a stabilizing material is hereinafter referred to as stabilized zirconia.

The oxide semiconductor film is deposited over the underlayer film containing stabilized zirconia having the (111) plane alignment, whereby the oxide semiconductor film including a crystal region having a high degree of crystallization can be provided directly on the underlayer film.

Note that the degree of crystallization refers to the proportion of a crystal region with respect to the entire film.

It is preferable that the underlayer film be flat because crystal growth of the oxide semiconductor film is easily caused.

Note that the oxide semiconductor film preferably contains zinc. When zinc is contained, it becomes easy to form an oxide semiconductor film which includes two or more crystal portions which are different from each other in a direction of a-axis, and the crystalline portions are c-axis aligned with respect to the underlayer film and have at least a triangular or hexagonal atomic arrangement when seen from a direction perpendicular to the a-b plane, the top surface, or the interface.

The oxide semiconductor film contains two or more kinds of elements selected from indium, gallium, zinc, tin, titanium, and aluminum.

The oxide semiconductor film can be formed by a sputtering method, a molecular beam epitaxy (MBE) method, an atomic layer deposition (ALD) method, or a pulse laser deposition (PLD) method.

The oxide semiconductor is deposited over an appropriate underlayer film and then is subjected to heat treatment, or the oxide semiconductor film is deposited over an appropriate underlayer film while being subjected to heat treatment, whereby the oxide semiconductor film including the crystal region can be formed directly on the underlayer film. It is preferable to perform both the heat treatment during the deposition of the oxide semiconductor film and the heat treatment after the deposition of the oxide semiconductor film.

According to one embodiment of the present invention, a semiconductor device having excellent electric characteristics can be manufactured.

DETAILED DESCRIPTION OF THE INVENTION

Figure 1A:
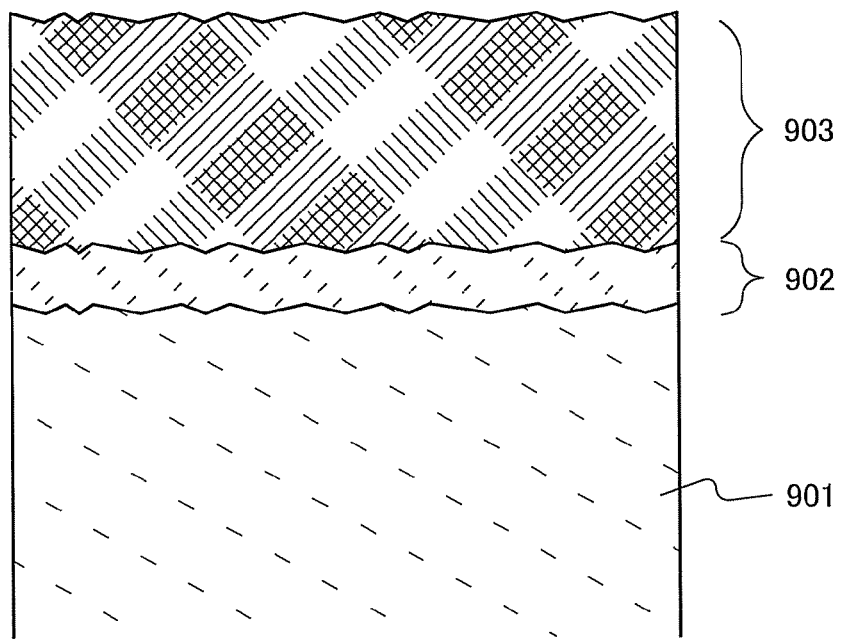
FIGS. 1A and 1B are cross-sectional views each illustrating an example of an oxide semiconductor film according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of the source and the drain of a transistor is called a drain, the other is called a source in this specification. That is, they are not distinguished depending on the potential level. Therefore, a portion called a source in this specification can be alternatively referred to as a drain. A portion simply called "source"

refers to any of a source electrode and a source region. Further, a portion simply called "drain" refers to any of a drain electrode and a drain region.

In addition, a voltage refers to a potential difference between a given potential and a reference potential (e.g., a ground potential) in many cases. Accordingly, a voltage can also be called a potential and vice versa.

Further, even when the expression "to be connected" is used in this specification, there is a case in which no physical connection is made in an actual circuit and a wiring is just extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a transistor which is a semiconductor device according to one embodiment of the present invention is described with reference to FIGS. 8A to 8C.

Figure 8A:
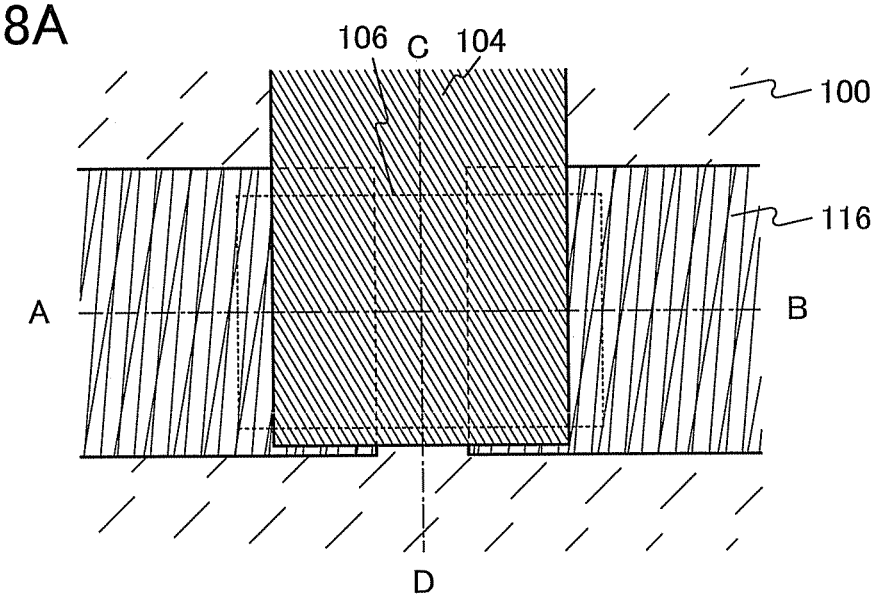
FIGS. 8A to 8C are a top view and cross-sectional views illustrating an example of a semiconductor device according to one embodiment of the present invention.

FIG. 8A is a top view of the transistor. A cross section along dashed-dotted line A-B in FIG. 8A and a cross section along dashed-dotted line C-D in FIG. 8A correspond to a cross section A-B in FIG. 8B and a cross section C-D in FIG. 8C, respectively.

Figure 8B:
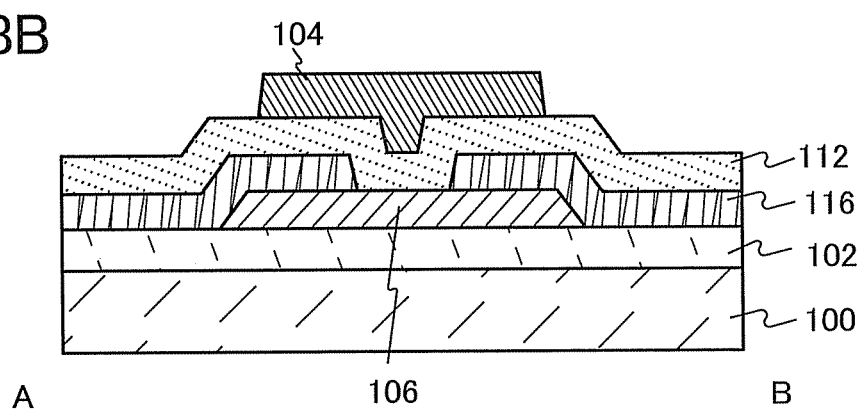

Here, the cross section A-B in FIG. 8B is described in detail.

Figure 8C:
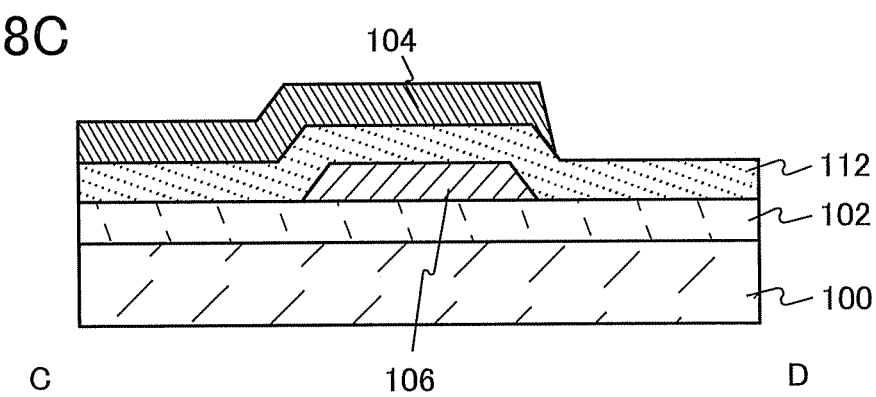

The transistor illustrated in FIGS. 8A to 8C includes a substrate 100, an underlayer film 102 over the substrate 100, an oxide semiconductor film 106 over the underlayer film 102, a pair of electrodes 116 which is positioned over the oxide semiconductor film 106 and is at least partly in contact with the oxide semiconductor film 106, a gate insulating film 112 over the oxide semiconductor film 106 and the pair of electrodes 116, and a gate electrode 104 which overlaps with the oxide semiconductor film 106 with the gate insulating film 112 provided therebetween.

In this embodiment, the oxide semiconductor film 106 is a c-axis aligned crystalline oxide semiconductor (CAAC-OS).

The CAAC-OS is an oxide semiconductor which includes two or more crystal portions which are different from each other in a direction of a-axis, and the crystal portions are c-axis aligned with respect to the underlayer film and have triangular atomic arrangement or hexagonal atomic arrangement when seen from a direction perpendicular to the a-b plane, the top surface, or the interface.

In a broad sense, the CAAC-OS means a non-single-crystal material including a phase which has a triangular or hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis.

The CAAC-OS is not a single crystal, but does not consist only of an amorphous portion. Although the CAAC-OS includes a crystal portion, a boundary between one crystal portion and another crystal portion is not clear in some cases.

Nitrogen may be substituted for part of oxygen which is a constituent of the CAAC-OS. The c-axes of individual crystalline portions included in the CAAC-OS may be aligned in one direction (e.g., the direction perpendicular to a surface of a substrate over which the CAAC-OS is formed, the top surface of the CAAC-OS, the interface of the CAAC-OS, or the like). Alternatively, normals of the a-b planes of individual crystalline portions included in the CAAC-OS may be aligned in one direction (e.g., the direction perpendicular to a surface of a substrate over which the CAAC-OS is formed, the top surface of the CAAC-OS, the interface of the CAAC-OS, or the like).

The CAAC-OS can become a conductor or an insulator by changing, for example, the composition thereof. The CAAC-OS transmits or does not transmit visible light depending on its composition or the like.

An example of a crystal structure of the CAAC-OS film is described in detail with reference to FIGS. 21A to 21E, FIGS. 22A to 22C, FIGS. 23A to 23C, and FIGS. 24A and 24B. In FIGS. 21A to 21E, FIGS. 22A to 22C, FIGS. 23A to 23C, and FIGS. 24A and 24B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 21A to 21E, O surrounded by a circle represents tetracoordinate O and O surrounded by a double circle represents tricoordinate O.

Figure 21A:
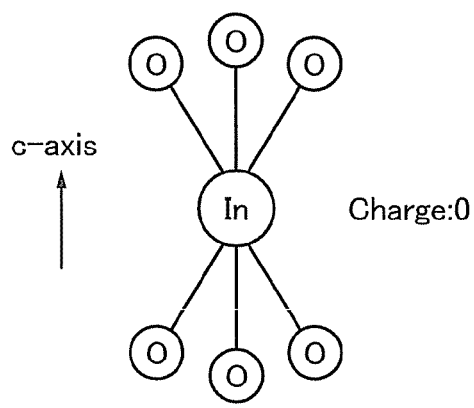
FIGS. 21A to 21E illustrate crystal structures of oxide semiconductors according to one embodiment of the present invention.

FIG. 21A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 21A is actually an octahedral structure, but is illustrated as a planar structure for simplicity. Note that three tetracoordinate O atoms exist in each of an upper half and a lower half in FIG. 21A. In the small group illustrated in FIG. 21A, the total electric charge is 0.

Figure 21D:
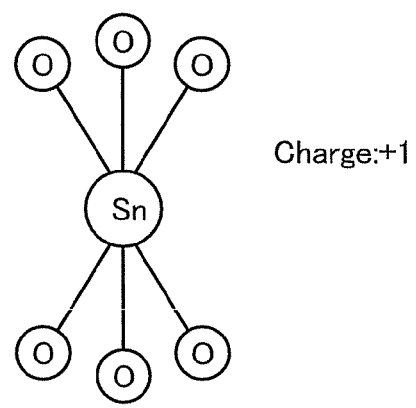
Figure 21B:
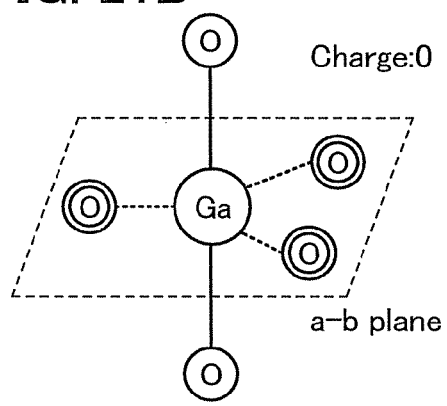

FIG. 21B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 21B. An In atom can also have the structure illustrated in FIG. 21B because an In atom can have five ligands. In the small group illustrated in FIG. 21B, the total electric charge is 0.

Figure 21E:
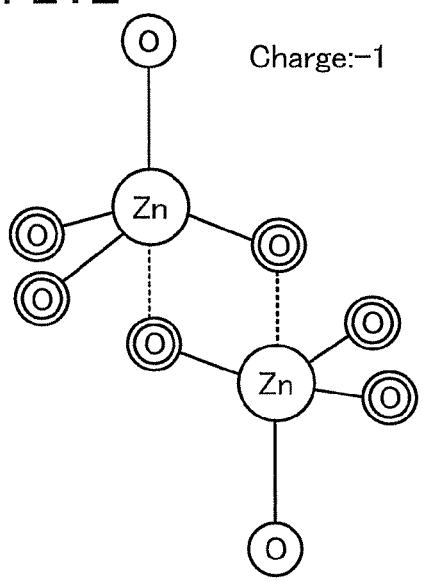
Figure 21C:
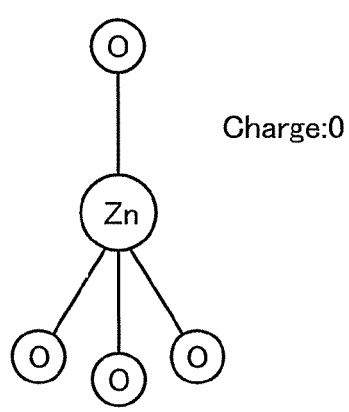

FIG. 21C illustrates a structure including one tetracoordinate Zn atom and four tetracoordinate O atoms proximate to the Zn atom. In FIG. 21C, one tetracoordinate O atom exists in an upper half and three tetracoordinate O atoms exist in a lower half Alternatively, three tetracoordinate O atoms may exist in the upper half and one tetracoordinate O atom may exist in the lower half in FIG. 21C. In the small group illustrated in FIG. 21C, the total electric charge is 0.

FIG. 21D illustrates a structure including one hexacoordinate Sn atom and six tetracoordinate O atoms proximate to the Sn atom. In FIG. 21D, three tetracoordinate O atoms exist in each of an upper half and a lower half. In the small group illustrated in FIG. 21D, the total electric charge is +1.

FIG. 21E illustrates a small group including two Zn atoms. In FIG. 21E, one tetracoordinate O atom exists in each of an upper half and a lower half. In the small group illustrated in FIG. 21E, the total electric charge is −1.

Here, a plurality of small groups form a medium group, and a plurality of medium groups form a large group.

Now, a rule of bonding between the small groups will be described. The three O atoms in the upper half with respect to the hexacoordinate In atom in FIG. 21A each have three proximate In atoms in the downward direction, and the three O atoms in the lower half each have three proximate In atoms in the upward direction. The one O atom in the upper half with respect to the pentacoordinate Ga atom in FIG. 21B has one proximate Ga atom in the downward direction, and the one O atom in the lower half has one proximate Ga atom in the upward direction. The one O atom in the upper half with respect to the tetracoordinate Zn atom in FIG. 21C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 22A:
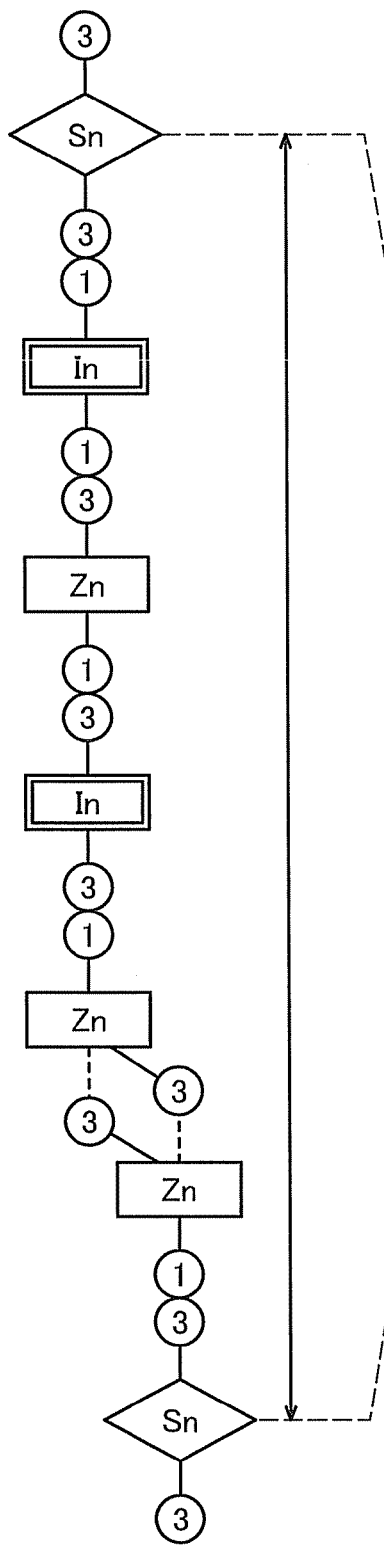
FIGS. 22A to 22C illustrate a crystal structure of an oxide semiconductor according to one embodiment of the present invention.
Figure 22B:
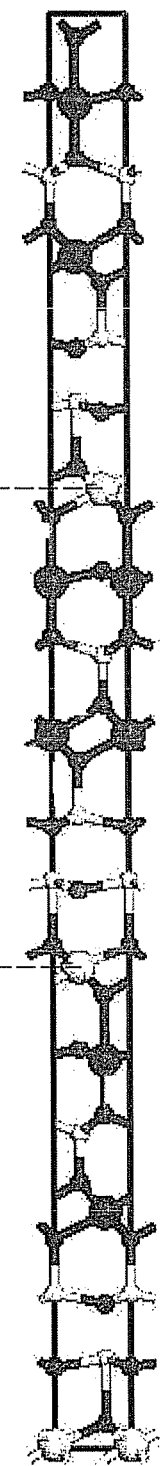
Figure 22C:
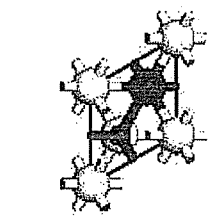

FIG. 22A illustrates a model of a medium group included in a layered structure of an In—Sn—Zn—O-based compound. FIG. 22B illustrates a large group including three medium groups. FIG. 22C illustrates an atomic arrangement in the case where the layered structure in FIG. 22B is observed from the c-axis direction.

In FIG. 22A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 22A, one tetracoordinate O atom existing in each of an upper half and a lower half with respect to an In atom is denoted by circled 1. FIG. 22A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based compound in FIG. 22A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, the total electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 21E can be given. For example, with one small group including two Zn atoms, electric charge of one small group including a Sn atom can be cancelled, so that the total electric charge of the layered structure can be 0.

Specifically, when the large group illustrated in FIG. 22B is repeated, a crystal of an In—Sn—Zn—O-based compound ($In_2SnZn_3O_8$) can be obtained. Note that a layered structure of the obtained In—Sn—Zn—O-based compound can be expressed as a composition formula, $In_2SnZnO_6(ZnO)_m$ (m is a natural number).

The above-described rule also applies to the following compound: an In—Sn—Ga—Zn—O-based compound, an In—Ga—Zn—O-based compound, an In—Al—Zn—O-based compound, a Sn—Ga—Zn—O-based compound, an Al—Ga—Zn—O-based compound, a Sn—Al—Zn—O-based compound, an In—Hf—Zn—O-based compound, an In—La—Zn—O-based compound, an In—Ce—Zn—O-based compound, an In—Pr—Zn—O-based compound, an In—Nd—Zn—O-based compound, an In—Sm—Zn—O-based compound, an In—Eu—Zn—O-based compound, an In—Gd—Zn—O-based compound, an In—Tb—Zn—O-based compound, an In—Dy—Zn—O-based compound, an In—Ho—Zn—O-based compound, an In—Er—Zn—O-based compound, an In—Tm—Zn—O-based compound, an In—Yb—Zn—O-based compound, an In—Lu—Zn—O-based compound, an In—Zn—O-based compound, a Sn—Zn—O-based compound, an Al—Zn—O-based compound, a Zn—Mg—O-based compound, a Sn—Mg—O-based compound, an In—Mg—O-based compound, an In—Ga—O-based compound, and the like.

Figure 23A:
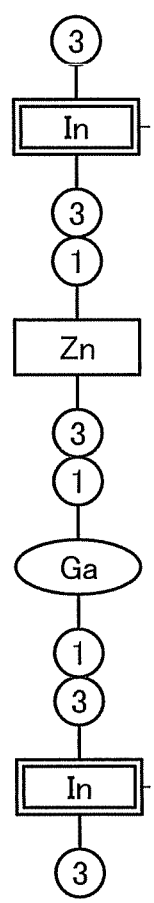
FIGS. 23A to 23C illustrate a crystal structure of an oxide semiconductor according to one embodiment of the present invention.

As an example, FIG. 23A illustrates a model of a medium group included in a layered structure of an In—Ga—Zn—O-based compound.

In the medium group included in the layered structure of the In—Ga—Zn—O-based compound in FIG. 23A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate atoms in each of an upper half and a lower half through one tetracoordinate O atom in a lower half with respect to the Ga atom. A plurality of such medium groups are bonded, so that a large group is formed.

Figure 23B:
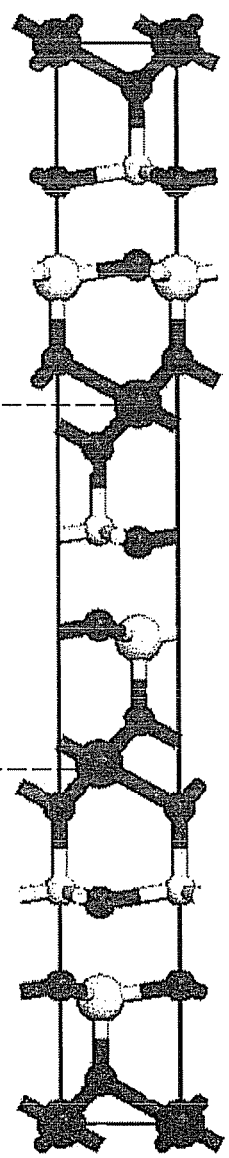
Figure 23C:
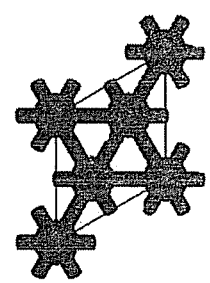

FIG. 23B illustrates a large group including three medium groups. Note that FIG. 23C illustrates an atomic arrangement in the case where the layered structure in FIG. 23B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based compound, a large group can be formed using not only the medium group illustrated in FIG. 23A but also a medium group in which the arrangement of the In atom, the Ga atom, and the Zn atom is different from that in FIG. 23A.

Specifically, when the large group illustrated in FIG. 23B is repeated, a crystal of an In—Ga—Zn—O-based compound can be obtained. Note that a layered structure of the obtained In—Ga—Zn—O-based compound can be expressed as a composition formula, $InGaO_3(ZnO)_n$ (n is a natural number).

Figure 24A:
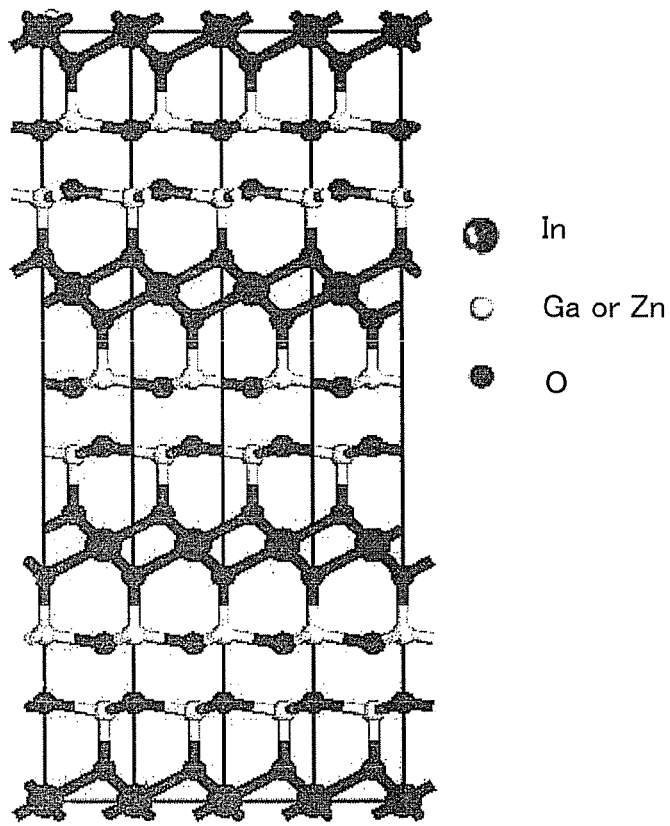
FIGS. 24A and 24B illustrate crystal structures of oxide semiconductors according to one embodiment of the present invention.

In the case where n is 1 ($InGaZnO_4$), a crystal structure illustrated in FIG. 24A can be obtained, for example. Note that in the crystal structure in FIG. 24A, since a Ga atom and an In atom each have five ligands as described in FIG. 21B, a structure in which Ga is replaced with In can be obtained.

Figure 24B:
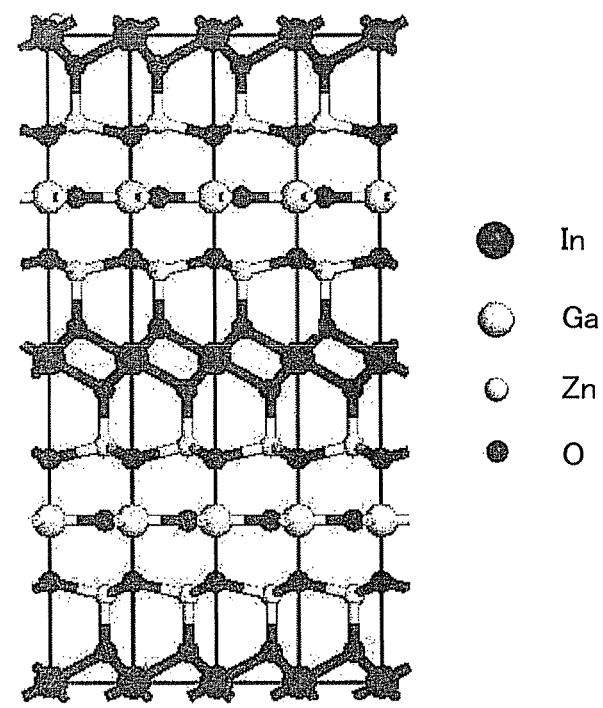

In the case where n is 2 ($InGaZn_2O_5$), a crystal structure illustrated in FIG. 24B can be obtained, for example. Note that in the crystal structure in FIG. 24B, since a Ga atom and an In atom each have five ligands as described in FIG. 21B, a structure in which Ga is replaced with In can be obtained.

The degree of crystallinity of the CAAC-OS in the vicinity of an interface with a film serving as a base is not sufficient in some cases depending on the film serving as a base. Specifically, an amorphous region might be formed in a region of the oxide semiconductor film ranging from an interface between the film serving as a base and the oxide semiconductor film to a position 3 nm to 15 nm away from the interface.

For example, in order to cause crystal growth of the oxide semiconductor film 106 from the interface between the oxide semiconductor film 106 and the underlayer film 102, the underlayer film 102 preferably has an atomic arrangement similar to that of the oxide semiconductor film 106.

For example, the underlayer film 102 contains zirconium oxide. When zirconium oxide contains yttrium oxide, the zirconium oxide has the (111) plane alignment. Such zirconium oxide containing yttrium oxide is also referred to as yttria-stabilized zirconia (YSZ). For example, the YSZ may contain zirconium oxide and yttrium oxide at 0.57:0.43 to 0.99:0.01 in a molar ratio (here, the total is 1). It is preferable that the YSZ contain zirconium oxide and yttrium oxide at 0.85:0.15 to 0.98:0.02 in a molar ratio (here, the total is 1). The underlayer film 102 is formed, for example, by a sputtering method, an evaporation method, a plasma chemical vapor deposition method (PCVD method), a pulsed laser deposition method (PLD method), an atomic layer deposition method (ALD method), a molecular beam epitaxy method (MBE method), or the like.

Note that YSZ which is deposited by a sputtering method under appropriate deposition conditions is strongly aligned in the (111) plane. A sputtering method is preferable because a film is easily deposited on a large area. Note that stabilized zirconium may be formed using calcium oxide, magnesium oxide, cerium oxide (ceria), or aluminum oxide (alumina) instead of yttrium oxide; however, only the YSZ described above is described in this specification for simplification. However, one embodiment of the present invention is not limited to the YSZ, and alternatively stabilized zirconia obtained by adding calcium oxide, magnesium oxide, cerium oxide, or aluminum oxide to zirconium oxide can be employed.

The underlayer film 102 is a YSZ film which contains zirconium oxide having a cubic crystal structure and strongly aligned in the (111) plane. The full width at half maximum (FWHM) of the YSZ film is less than or equal to 1°, preferably less than or equal to 0.6°, more preferably less than or equal to 0.4° at a peak positioned between 29° and 31° obtained by an X-ray diffraction (XRD) method.

When the YSZ film is used as the underlayer film 102, the crystal growth of the oxide semiconductor film 106 can easily occur from the interface between the underlayer film 102 and the oxide semiconductor film 106. This is because the zirconium oxide having a cubic crystal structure has an equilateral triangle atomic arrangement when seen from the (111) plane side, and can have consistency with the crystal region of the CAAC-OS having an atomic arrangement similar thereto. However, when a lattice mismatch factor of the atomic arrangement (a value obtained by dividing a difference between B and A by B (|B−A|/B) within a plane where the lower layer and the upper layer are in contact with each other, where A represents the nearest neighbor interatomic distance of the upper layer and B represents the nearest neighbor interatomic distance of the lower layer) is large, the crystal growth is less likely to occur from the interface between the underlayer film and the oxide semiconductor film. In general, as a lattice mismatch factor of an atomic arrangement is increased, a thickness of a portion in which crystal growth occurs becomes small; as a lattice mismatch factor of an atomic arrangement is reduced, a thickness of a portion in which crystal growth occurs becomes large. Therefore, it is preferable that the lattice mismatch factor of the atomic arrangement between the underlayer film 102 and the oxide semiconductor film 106 be as low as possible. Specifically, a material may be selected so that the lattice mismatch factor of the atomic arrangement is less than or equal to 0.15, preferably less than or equal to 0.12, more preferably less than or equal to 0.10, still more preferably less than or equal to 0.08.

For example, $InGa_3(ZnO)_m$ (m>0), which is an oxide semiconductor, is deposited over the YSZ film by a sputtering method while being heated, whereby a crystal region of $InGaO_3(ZnO)_m$ (m>0) which has a hexagonal crystal structure and has a c-axis alignment can be formed in the vicinity of the interface with the YSZ film.

Note that in the case of YSZ whose lattice constant a is approximately 0.51 nm, the nearest neighbor interatomic distance is approximately 0.36 nm at minimum when seen from a direction perpendicular to the (111) plane. In addition, the lattice constant a of $InGaO_3(ZnO)$ is 0.3295 nm, the lattice constant a of $InGa(ZnO)_2$ is 0.3292 nm, and the lattice constant a of $InGaZn_3O_6$ is 0.3288 nm (see Non-Patent Document 1). Accordingly, the lattice mismatch factor of the atomic arrangement is approximately 0.09, so that it is possible to cause the crystal growth of $InGaO_3(ZnO)_m$ (m>0), which is an oxide semiconductor, over the YSZ. However, it is known that the lattice constant a of the YSZ is varied depending on its composition ratio and thus the lattice constant a of the YSZ is not limited to the above value.

Figure 19A:
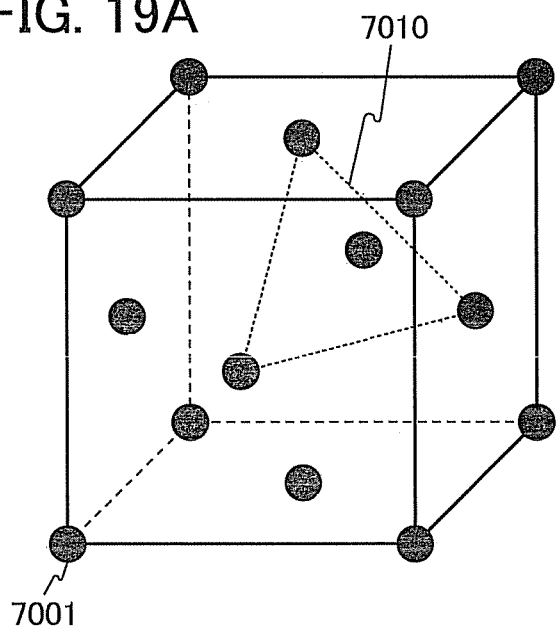
FIGS. 19A and 19B illustrate a unit cell of cubic crystal structure and a unit cell of hexagonal crystal structure, respectively.

FIG. 19A illustrates a face-centered cubic lattice. In the face-centered cubic lattice, when atoms 7001 which are positioned in face center are connected to each other with dotted lines 7010, an equilateral triangle which is parallel to the (111) plane and whose one side (nearest neighbor interatomic distance) is √2/2 of the lattice constant a is formed.

Figure 19B:
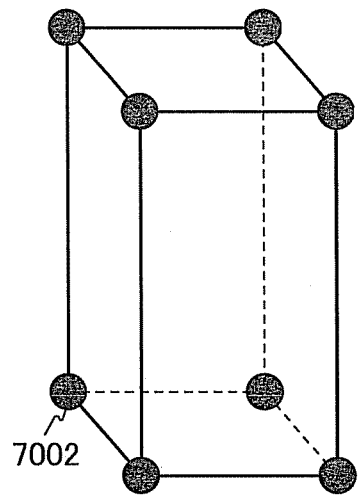

FIG. 19B illustrates a hexagonal unit cell. In the hexagonal unit cell, a bottom surface thereof is a rhombus in which a pair of opposite interior angles are 60° each, and the other pair of interior angles are 120° each, and thus when three atoms 7002 are selected, the three atoms 7002 form an equilateral triangle whose one surface is the lattice constant a.

In other words, in the case where a film having a hexagonal crystal structure with the c-axis alignment illustrated in FIG. 19B (here, the In—Ga—Zn—O film) is stacked over a film with the (111) plane alignment illustrated in FIG. 19A (here, the YSZ film), and the atomic arrangement denoted by the dotted lines 7010 matches with the atomic arrangement denoted by the dotted lines 7020, crystal growth of the film which has the hexagonal crystal structure and has the c-axis alignment is easily caused over the film having the (111) plane alignment.

In order to cause crystal growth of the oxide semiconductor film 106 from the interface between the oxide semiconductor film 106 and the underlayer film 102, the underlayer film 102 preferably has sufficient planarity.

Specifically, the underlayer film 102 is provided so as to have an average surface roughness (Ra) of 1 nm or less, preferably 0.3 nm or less. Note that Ra is obtained by expanding arithmetic mean surface roughness, which is defined by JIS B0601: 2001 (ISO4287: 1997), into three dimensions so as to be applicable to a curved surface. In addition, Ra can be expressed as "an average value of the absolute values of deviations from a reference surface to a specific surface" and is defined by Formula 1.

$$Ra = \frac{1}{S_0} \int_{y_2}^{y_1} \int_{x_2}^{x_1} |f(x, y) - Z_0| dx dy \qquad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the average height of the specific surface. Ra can be measured using an atomic force microscope (AFM).

Here, focusing on the film serving as a base and the oxide semiconductor film, how the crystal state of the oxide semiconductor film varies depending on the film serving as a base is described with reference to FIGS. 1A and 1B.

FIG. 1A is a cross-sectional view in which an underlayer film 901 which has an uneven surface over which an oxide semiconductor film is deposited and has an atomic arrangement with a high lattice mismatch factor with respect to an atomic arrangement of a crystal of the oxide semiconductor film, and the oxide semiconductor film which is provided over the underlayer film 901 and includes a first region 902 and a second region 903 are provided.

Here, a difference between the first region 902 and the second region 903 is a proportion of an amorphous region to a crystal region. The first region 902 has a higher proportion of the amorphous region than the second region 903. Note that the first region 902 has a thickness of approximately 3 nm to 15 nm, but cannot be distinguished from the second region 903 in some cases.

Specifically, the first region 902 has a degree of crystallinity of less than 0.1. The second region 903 has a degree of crystallinity of greater than or equal to 0.1, preferably greater than or equal to 0.3, more preferably greater than or equal to 0.5, still more preferably greater than or equal to 0.7.

Figure 1B:
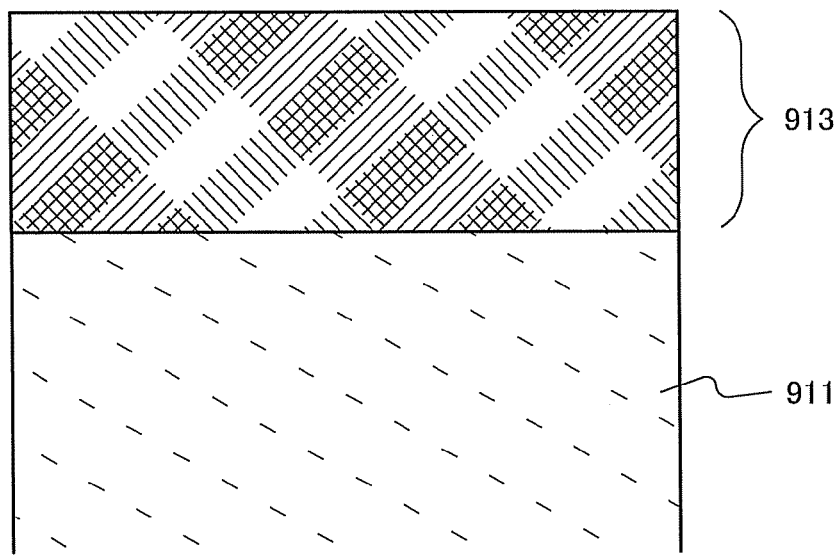

Similarly, FIG. 1B is a cross-sectional view in which an underlayer film 911 which has a planar surface over which an oxide semiconductor film is deposited and has an atomic arrangement with a low lattice mismatch factor with respect to an atomic arrangement of a crystal of the oxide semiconductor film, and the oxide semiconductor film which is provided over the underlayer film 911 and includes a third region 913 are provided.

Here, the third region 913 has a degree of crystallinity similar to that of the second region 903.

That is, when the film serving as a base has planarity, the oxide semiconductor film including a region with a high degree of crystallinity can be provided directly on the film serving as a base.

In addition, when the film serving as abase has the atomic arrangement with a low lattice mismatch factor with respect to the atomic arrangement of the crystal of the oxide semiconductor film, the oxide semiconductor film including regions with a high degree of crystallinity can be provided directly on the film serving as a base.

For the oxide semiconductor film 106, any of the following can be used, for example: an In—Zn—O-based compound, an Sn—Zn—O-based compound, an Al—Zn—O-based compound, a Zn—Mg—O-based compound, an Sn—Mg—O-based compound, an In—Mg—O-based compound, an In—Ga—O-based compound, an In—Ga—Zn—O-based compound, an In—Al—Zn—O-based compound, an In—Sn—Zn—O-based compound, an Sn—Ga—Zn—O-based compound, an Al—Ga—Zn—O-based compound, an Sn—Al—Zn—O-based compound, an In—Hf—Zn—O-based compound, an In—La—Zn—O-based compound, an In—Ce—Zn—O-based compound, an In—Pr—Zn—O-based compound, an In—Nd—Zn—O-based compound, an In—Sm—Zn—O-based compound, an In—Eu—Zn—O-based compound, an In—Gd—Zn—O-based compound, an In—Tb—Zn—O-based compound, an In—Dy—Zn—O-based compound, an In—Ho—Zn—O-based compound, an In—Er—Zn—O-based compound, an In—Tm—Zn—O-based compound, an In—Yb—Zn—O-based compound, an In—Lu—Zn—O-based compound, an In—Sn—Ga—Zn—O-based compound, an In—Hf—Ga—Zn—O-based compound, an In—Al—Ga—Zn—O-based compound, an In—Sn—Al—Zn—O-based compound, an In—Sn—Hf—Zn—O-based compound, and an In—Hf—Al—Zn—O-based compound.

For example, the "In—Ga—Zn—O-based compound" means an oxide containing In, Ga, and Zn as its main components, in which no particular limitation on the ratio of In:Ga:Zn.

For example, with an In—Sn—Zn—O-based compound, high field-effect mobility can be relatively easily realized. Specifically, the field-effect mobility of the transistor can be increased to 31 $cm^2/Vs$ or more, 40 $cm^2/Vs$ or more, 60 $cm^2/Vs$ or more, 80 $cm^2/Vs$ or more, or 100 $cm^2/Vs$ or more. Further, even with any material (e.g., an In—Ga—Zn—O-based compound) other than the In—Sn—Zn—O-based compound, the field-effect mobility can be increased by reducing the defect density.

The field-effect mobility of a transistor will be described with, reference to FIG. 25, FIGS. 26A to 26C, FIGS. 27A to 27C, and FIGS. 28A to 28C.

The field-effect mobility of a transistor tends to be measured lower than its inherent field-effect mobility for a variety of reasons; this phenomenon occurs not only in the case of using an oxide semiconductor. The field-effect mobility is decreased partly because a defect is formed inside a semiconductor or at an interface between the semiconductor and an insulating film. Here, the field-effect mobility on the assumption that no defect exists inside the semiconductor is calculated theoretically by using a Levinson model.

Assuming that the inherent field-effect mobility of the transistor is $\mu_0$ and a potential barrier (such as a grain boundary) exists in the semiconductor, the measured field-effect mobility $\mu$ is expressed by Formula 2.

$$\mu = \mu_0 \exp\left(-\frac{E}{kT}\right) \quad \text{[Formula 2]}$$

Here, E represents the height of the potential barrier, k represents the Boltzmann constant, and T represents the absolute temperature. Note that according to the Levinson model, the height of the potential barrier E is assumed to be attributed to a defect and is expressed by Formula 3.

$$E = \frac{e^2 N^2}{8\varepsilon n} = \frac{e^3 N^2 t}{8\varepsilon C_{ox} V_{gs}} \quad \text{[Formula 3]}$$

Here, e represents the elementary charge, N represents the average defect density per unit area of a channel, ∈ represents the dielectric constant of the semiconductor, n represents the carrier density per unit area of a channel, $C_{ox}$ represents the capacitance of the gate insulating film per unit area, $V_{gs}$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_{ds}$ in a linear region is expressed as Formula 4.

$$\frac{I_{ds}}{V_{gs}} = \frac{W \mu V_{ds} C_{ox}}{L} \exp\left(-\frac{E}{kT}\right) \quad \text{[Formula 4]}$$

Here, L represents the channel length and W represents the channel width, and L and W are each 10 μm. In addition, $V_{ds}$ represents the drain voltage.

When taking logarithms of both sides of Formula 4, Formula 5 can be obtained.

$$\ln\left(\frac{I_{ds}}{V_{gs}}\right) = \quad \text{[Formula 5]}$$
$$\ln\left(\frac{W \mu V_{ds} C_{ox}}{L}\right) - \frac{E}{kT} = \ln\left(\frac{W \mu V_{ds} C_{ox}}{L}\right) - \frac{e^3 N^2 t}{8kT\varepsilon C_{ox} V_{gs}}$$

The right side of Formula 5 is a function of $V_{gs}$; thus, the defect density N can be obtained from the slope of a line in a graph which is obtained by plotting actual measured values with $\ln(I_{ds}/V_{gs})$ as the ordinate and $1/V_{gs}$ as the abscissa. That is, the defect density N in the semiconductor can be obtained from the $V_{gs}$-$I_{ds}$ characteristics of the transistor.

Defect density N in a semiconductor depends on a substrate heating temperature in the formation of the semiconductor. In the case where the semiconductor is an oxide semiconductor deposited using an In—Sn—Zn—O target of In:Sn:Zn=1:1:1 [atomic ratio], the defect density N in the oxide semiconductor is approximately $1 \times 10^{12}/\text{cm}^2$.

Calculating with Formulas 2 and 3 on the basis of the above defect density N in the oxide semiconductor, the inherent field-effect mobility $\mu_0$ of the transistor comes to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility $\mu_0$ is found to be 120 cm²/Vs. By contrast, in the case of using an oxide semiconductor with many defects, the field-effect mobility p of a transistor is approximately 30 cm²/Vs.

Further, even when no defect exists inside the semiconductor, scattering at an interface between the channel and the gate insulating film adversely affects the transport properties of the transistor. The field-effect mobility $\mu_1$ at a position that is distance x away from the interface between the channel and the gate insulating film is expressed by Formula 6.

$$\frac{1}{\mu_1} = \frac{1}{\mu_0} + \frac{D}{B} \exp\left(-\frac{x}{l}\right) \quad \text{[Formula 6]}$$

Here, D represents the electric field intensity by the gate electrode, B represents a constant, and l represents the depth at which the adverse effect of scattering at the interface is caused. Values of B and l can be obtained from actual measurement of the electrical characteristics of the transistor; according to actual measurement of the electrical characteristics of the transistor including the above oxide semiconductor, B is $4.75 \times 10^7$ cm/s and l is 10 nm. As D is increased, i.e., as $V_{gs}$ is increased, the second term of Formula 6 increases and accordingly the field-effect mobility $\mu_1$ decreases.

Figure 25:
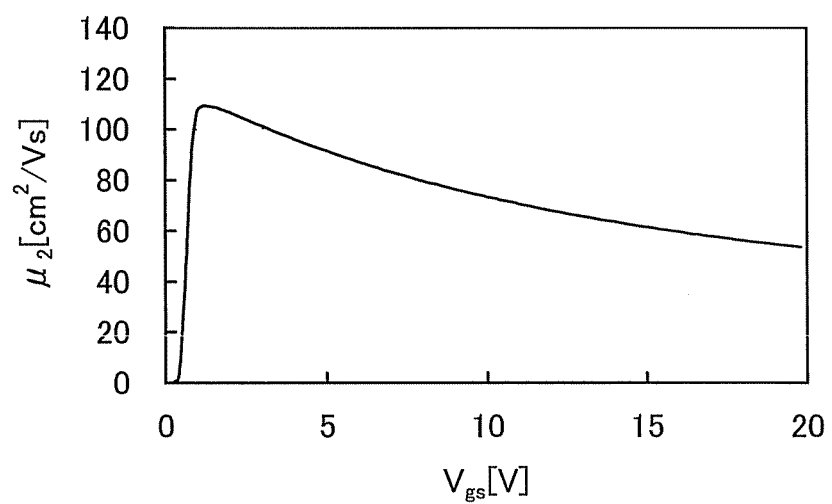
FIG. 25 shows $V_{gs}$ dependence of field-effect mobility obtained by calculation.

FIG. 25 shows calculation results of the field-effect mobility $\mu_2$ of an ideal transistor in which no defect exists inside an oxide semiconductor and at an interface between the oxide semiconductor and a gate insulating film that is in contact with the oxide semiconductor. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work function of a gate is assumed to be 5.5 eV, and the work functions of a source and a drain were each assumed to be 4.6 eV. The thickness of the gate insulating film was assumed to be 100 nm, and the relative permittivity thereof was assumed to be 4.1. The channel length and the channel width were each assumed to be 10 μm and $V_{ds}$ was assumed to be 0.1 V.

As shown in FIG. 25, the field-effect mobility $\mu_2$ has a peak of 100 cm²/Vs or more at $V_{gs}$ of around 1 V and then decreases as $V_{gs}$ becomes higher because the influence of interface scattering increases.

Calculation results in the case where such an ideal transistor is miniaturized are shown in FIGS. 26A to 26C, FIGS. 27A to 27C, and FIGS. 28A to 28C. Note that in the calculation, a transistor having any of the structures illustrated in FIGS. 29A to 29C was assumed.

Figure 29A:
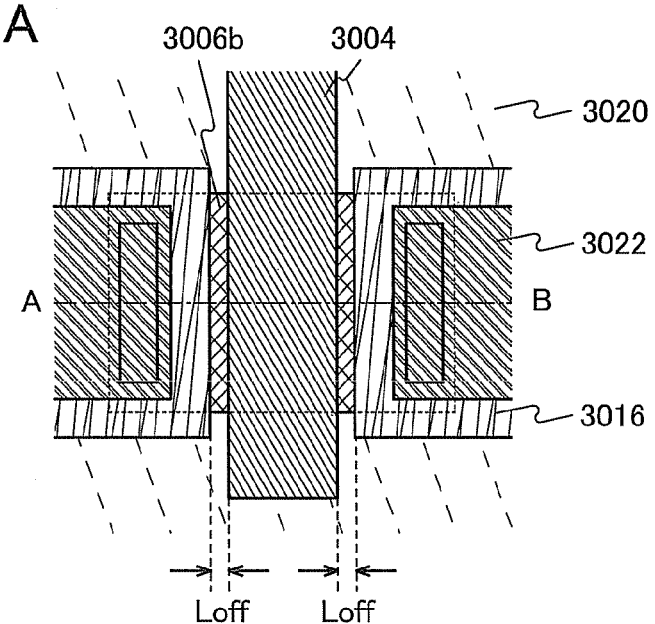
FIGS. 29A to 29C are a top view and cross-sectional views of a transistor.
Figure 29B:
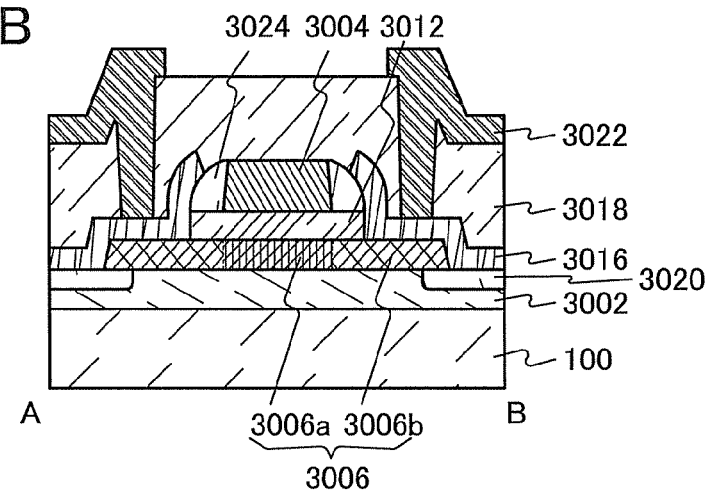
Figure 29C:
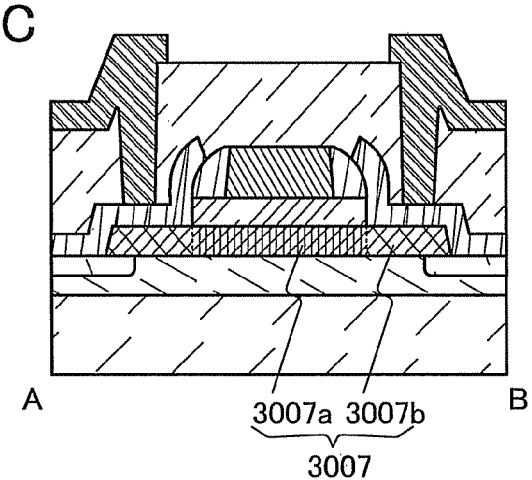

Next, the structures of transistors illustrated in FIGS. 29A to 29C are described. FIG. 29A is a top view of the transistor. FIG. 29B is a cross-sectional view corresponding to dashed-dotted line A-B in FIG. 29A.

The transistor illustrated in FIG. 29B includes the substrate 100; a base insulating film 3002 provided over the substrate 100; a protective film 3020 provided on the periphery of the base insulating film 3002; an oxide semiconductor film 3006 which is provided over the base insulating film 3002 and the protective film 3020 and includes a high-resistance region 3006a and a low-resistance region 3006b; a gate insulating film 3012 provided over the oxide semiconductor film 3006; a gate electrode 3004 provided to overlap with the oxide semiconductor film 3006 with the gate insulating film 3012 provided therebetween; sidewall insulating films 3024 provided in contact with side surfaces of the gate electrode 3004; a pair of electrodes 3016 which is provided over the oxide semiconductor film 3006 and is at least partly in contact with the oxide semiconductor film 3006; a protective insulating film 3018 provided to cover the gate electrode 3004, the sidewall insulating film 3024, and the pair of electrodes 3016; and wirings 3022 which are provided in contact with the pair of electrodes 3016 through openings provided in the protective insulating film 3018.

Here, the resistivity of the low-resistance region 3006b was assumed to be $2\times10^{-3}$ Ωcm, and the width of the gate electrode 3004, that of the sidewall insulating film 3024, and the channel width were assumed to be 33 nm, 5 nm, and 40 nm, respectively. The channel region is referred to as the high-resistance region 3006a for convenience, but the channel region was assumed to be an intrinsic semiconductor here.

Figure 26A:
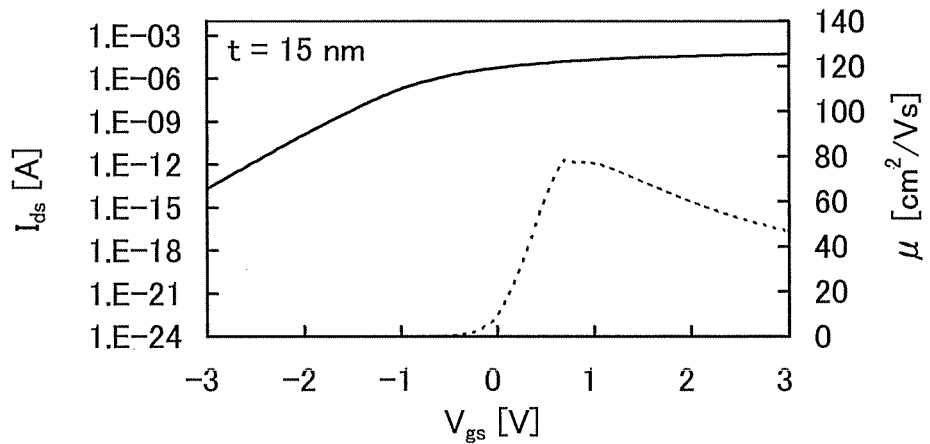
FIGS. 26A to 26C show $V_{gs}$ dependence of $I_{ds}$ and field-effect mobility obtained by calculation.
Figure 26B:
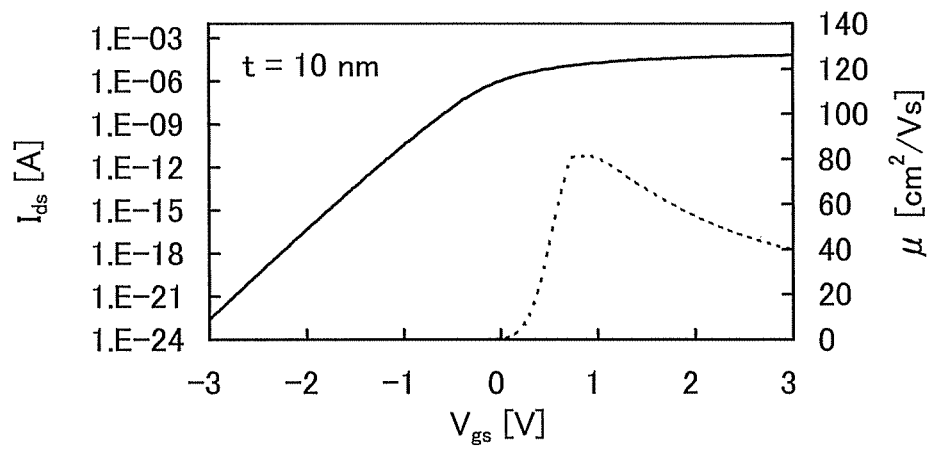
Figure 26C:
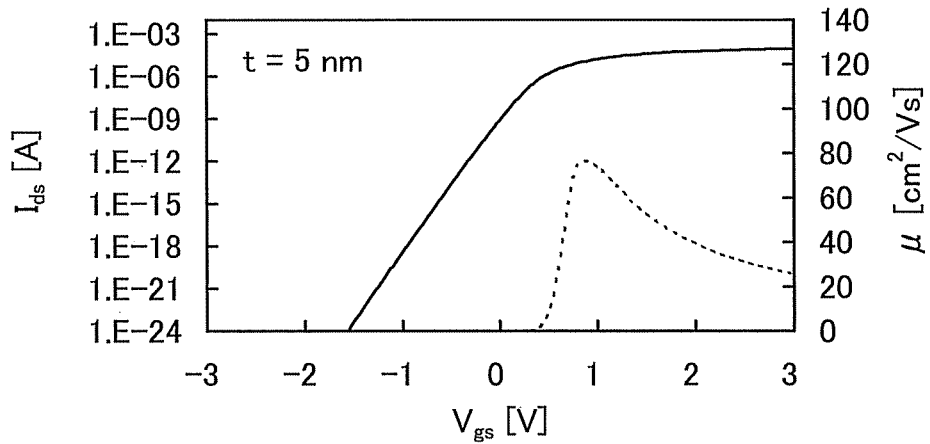

For the calculation, Sentaurus Device manufactured by Synopsys, Inc. was used. FIGS. 26A to 26C show $V_{gs}$ dependence of $I_{ds}$ (a solid line) and the field-effect mobility μ (a dotted line) of the transistor having the structure illustrated in FIG. 29B. Note that $I_{ds}$ is obtained in the condition in which $V_{ds}$ is 1 V and the field-effect mobility μ is obtained in the condition in which $V_{ds}$ is 0.1 V. FIG. 26A shows the results where the thickness of the gate insulating film was 15 nm, FIG. 26B shows the results where the thickness of the gate insulating film was 10 nm, and FIG. 26C shows the results where the thickness of the gate insulating film was 5 nm.

FIGS. 26A to 26C show that as the gate insulating film becomes thinner, the drain current $I_{ds}$ in an off state (here, in the range of $V_{gs}$ from −3 V to 0 V) decreases. On the other hand, there is no noticeable change in the peak value of the field-effect mobility μ and the drain current $I_{ds}$ in an on state (here, in the range of $V_{gs}$ from 0 V to 3 V). FIGS. 26A to 26C show that $I_{ds}$ exceeds 10 μA, which is requisite for a memory and the like that are semiconductor devices, at $V_{gs}$ of around 1 V.

Similarly, the calculation was also conducted on the transistor illustrated in FIG. 29C. The transistor illustrated in FIG. 29C is different from the transistor illustrated in FIG. 29B in that an oxide semiconductor film 3007 including a high-resistance region 3007a and a low-resistance region 3007b is provided. Specifically, in the transistor illustrated in FIG. 29C, a region of the oxide semiconductor film 3007 which overlaps with the sidewall insulating film 3024 is included in the high-resistance region 3007a. The transistor is, in other words, a transistor having an offset region whose width is the same as the width of the sidewall insulating film 3024. Note that the width of the offset region is also referred to as an offset length (Loff) (see FIG. 29A). Note that Loff on the right side has the same width as Loff on the left side for convenience.

Figure 27A:
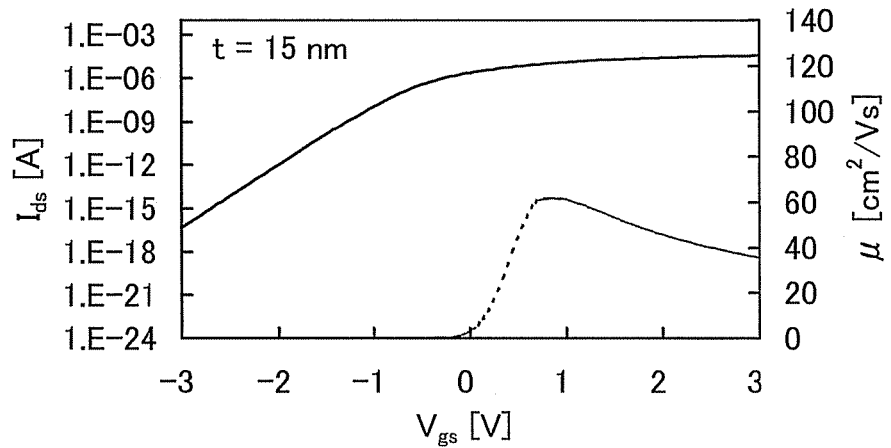
FIGS. 27A to 27C show $V_g$, dependence of $I_{ds}$ and field-effect mobility obtained by calculation.
Figure 27B:
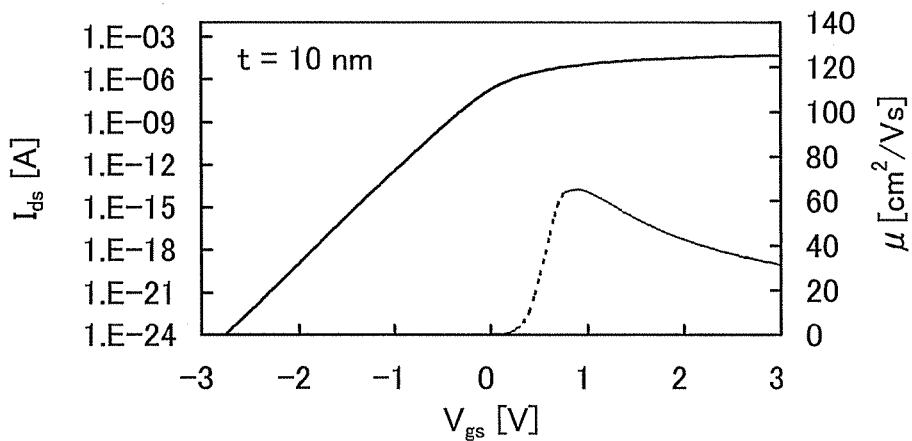
Figure 27C:
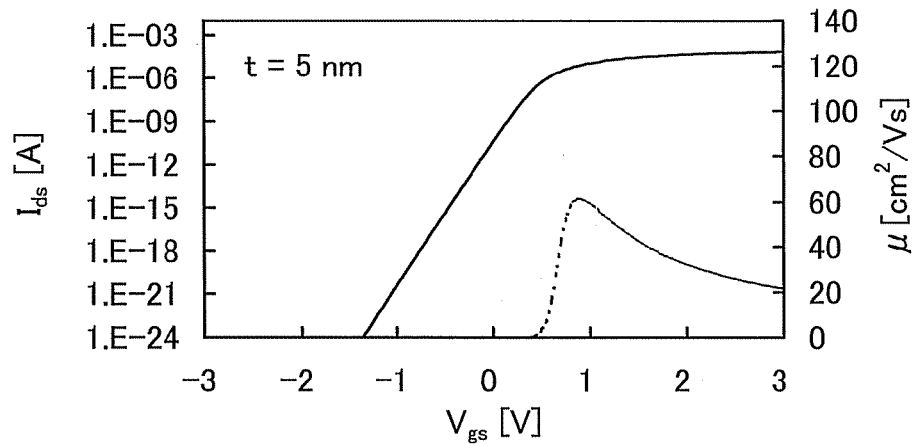

FIGS. 27A to 27C show $V_{gs}$ dependence of the drain current $I_{ds}$ (solid line) and the field-effect mobility μ (dotted line) of the transistor illustrated in FIG. 29C in which Loff is 5 nm. Note that $I_{ds}$ was calculated at $V_{ds}$ of 1 V and the field-effect mobility was calculated at $V_{ds}$ of 0.1 V. FIG. 27A shows the results where the thickness of the gate insulating film was 15 nm, FIG. 27B shows the results where the thickness of the gate insulating film was 10 nm, and FIG. 27C shows the results where the thickness of the gate insulating film was 5 nm.

Figure 28A:
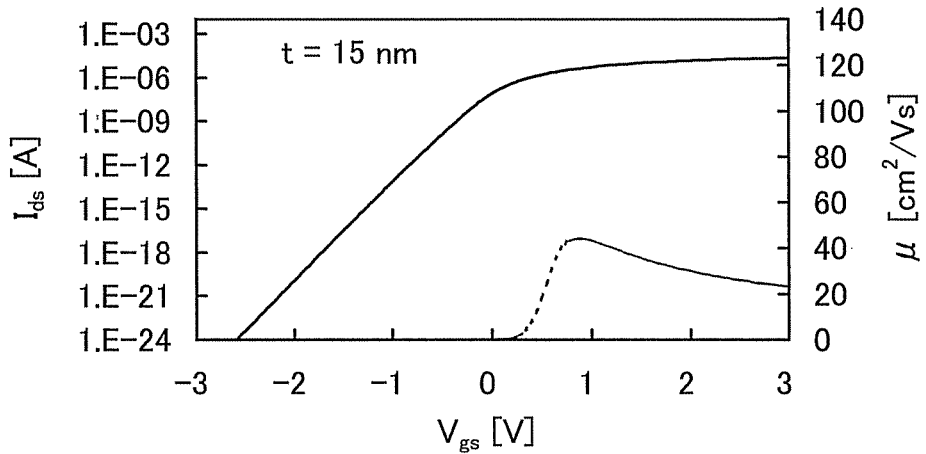
FIGS. 28A to 28C show $V_{gs}$ dependence of $I_{ds}$ and field-effect mobility obtained by calculation.
Figure 28B:
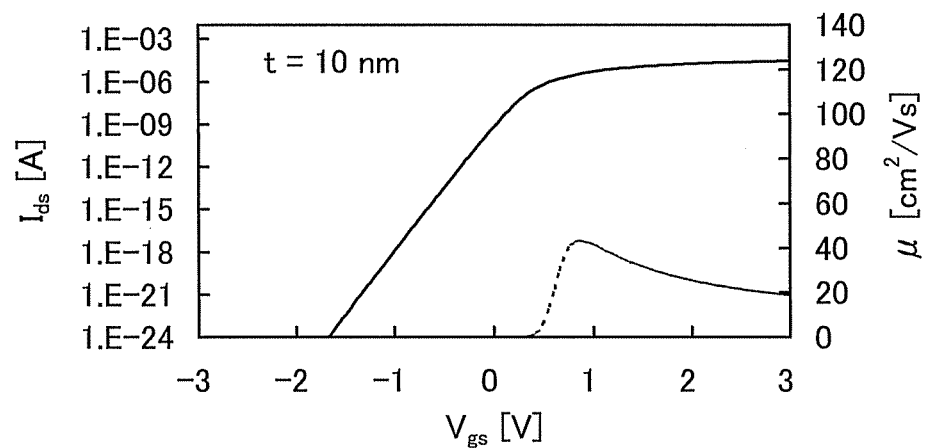
Figure 28C:
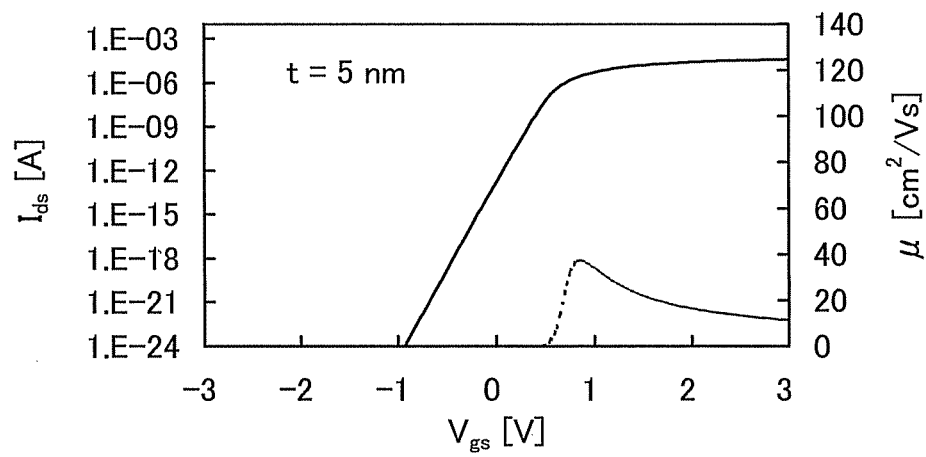

FIGS. 28A to 28C show $V_{gs}$ dependence of the drain current $I_{ds}$ (solid line) and the field-effect mobility μ (dotted line) of the transistor illustrated in FIG. 29C in which Loff is 15 nm. Note that $I_{ds}$ was calculated at $V_{ds}$ of 1 V and the field-effect mobility μ was calculated at $V_{ds}$ of 0.1 V. FIG. 28A shows the results where the thickness of the gate insulating film was 15 nm, FIG. 28B shows the results where the thickness of the gate insulating film was 10 nm, and FIG. 28C shows the results where the thickness of the gate insulating film was 5 nm.

Both the calculation results in FIGS. 27A to 27C and those in FIGS. 28A to 28C show that, similarly to FIGS. 26A to 26C, as the gate insulating film becomes thinner, the drain current $I_{ds}$ in an off state (here, in the range of $V_{gs}$ from −3 V to 0 V) decreases. On the other hand, it is also found that there is no noticeable change in the peak value of the field-effect mobility μ and the drain current $I_{ds}$ in an on state (here, in the range of $V_{gs}$ from 0 V to 3 V).

Note that the peak of the field-effect mobility μ is approximately 80 cm²/Vs in FIGS. 26A to 26C, approximately 60 cm²/Vs in FIGS. 27A to 27C, and approximately 40 cm²/Vs in FIGS. 28A to 28C; thus, the peak of the field-effect mobility μ decreases as the offset length Loff is increased. Further, it is that the same applies to $I_{ds}$ in the off state. The drain current $I_{ds}$ in an on state also decreases as the offset length Loff is increased, which is, however, much more gradual than the decrease in $I_{ds}$ in the off-state current. Any calculation result shows that $I_{ds}$ exceeds 10 μA, which is requisite for a memory and the like, at $V_{gs}$ of around 1 V.

In the case where an In—Zn—O-based compound is used for the oxide semiconductor film 106, the atomic ratio of In to Zn is greater than or equal to 0.5 and less than or equal to 50, preferably greater than or equal to 1 and less than or equal to 20, further preferably greater than or equal to 1.5 and less than or equal to 15. When the atomic ratio of Zn is within the above range, the field-effect mobility of the transistor can be improved. Here, when the atomic ratio of the compound is In:Zn:O=X:Y:Z, the relation of Z>1.5X+Y is preferably satisfied.

A material represented by 1 $nMO_3(ZnO)_m$ (m>0) may be used for the oxide semiconductor film 106. Here, M represents one or more metal elements selected from Zn, Ga, Al, Mn, Sn, Hf, and Co. For example, M may be Ga, Ga and Al, Ga and Mn, Ga and Co, or the like.

The oxide semiconductor film 106 is formed using a material whose band gap is 2.5 eV or more, preferably 2.8 eV or more, further preferably 3.0 eV or more in order to reduce the off-state current of the transistor. However, a material having semiconductor characteristics and a band gap in the above range may be used instead of the oxide semiconductor film.

In the oxide semiconductor, part of hydrogen serves as a donor to generate a carrier. Therefore, the concentration of hydrogen contained in the oxide semiconductor film 106 is lower than $5\times10^{18}$ atoms/cm³, preferably lower than or equal to $1\times10^{18}$ atoms/cm³, more preferably lower than or equal to $5\times10^{17}$ atoms/cm³, still more preferably lower than or equal to $1\times10^{16}$ atoms/cm³.

Alkali metal is not an element included in an oxide semiconductor, and therefore, is an impurity. Also, alkaline earth metal is impurity in the case where alkaline earth metal is not included in an oxide semiconductor. Alkali metals, in particular, Sodium (Na) diffuses in an insulating film which is in contact with the oxide semiconductor film to become Na⁺. In addition; in the oxide semiconductor film, Na cuts or enters a bond between metal and oxygen which are included in an oxide semiconductor. As a result, for example, deterioration of characteristics of the transistor such as shift of a threshold voltage in the negative direction to lead to a normally-on state transistor or a reduction in field-effect mobility occurs; in addition, variation in characteristics is also caused. Therefore, it is preferable to reduce the concentration of the impurity in the oxide semiconductor film. Specifically, it is preferable that the Na concentration which is measured by secondary ion mass spectroscopy be lower than or equal to $5\times10^{16}$ atoms/cm³, more preferably lower than or equal to $1\times10^{16}$ atoms/cm³, still more preferably lower than or equal to $1\times10^{15}$ atoms/cm³. In addition, the measurement value of the concentration of lithium (Li) is preferably lower than or equal to $5 \times 10^{15}$ atoms/cm$^3$, more preferably lower than or equal to $1 \times 10^{15}$ atoms/cm$^3$. Further, the measurement value of the concentration of potassium (K) is preferably lower than or equal to $5 \times 10^{15}$ atoms/cm$^3$, more preferably lower than or equal to $1 \times 10^{15}$ atoms/cm$^3$.

In the oxide semiconductor film 106, hydrogen, an alkali metal, an alkaline earth metal, and the like are reduced and the concentration of impurities is very low. Therefore, in a transistor whose channel region is formed using the oxide semiconductor film 106, off-state current can be reduced.

By using the oxide semiconductor film 106 described above, the off-state current of the transistor can be reduced. For example, the off-state current of the transistor where the channel length is 3 μm and the channel width is 1 μm can be less than or equal to $1 \times 10^{-18}$ A, less than or equal to $1 \times 10^{-21}$ A, or less than or equal to $1 \times 10^{-24}$ A.

The underlayer film 102 preferably has a stacked-layer structure including a YSZ film and a film which releases oxygen by heat treatment. When such a film which releases oxygen by heat treatment is used, defects in the oxide semiconductor film 106 can be repaired and deterioration in electric characteristics of the transistor can be suppressed. However, in the stacked-layer structure of the underlayer film 102, the YSZ film is positioned on a side in contact with the oxide semiconductor film 106. For example, a silicon oxide film which releases oxygen by the heat treatment is formed to a thickness of greater than or equal to 50 nm and less than or equal to 600 nm, preferably greater than or equal to 200 nm and less than or equal to 500 nm, and then a YSZ film is formed to a thickness of greater than or equal to 1 nm and less than or equal to 50 nm, preferably greater than or equal to 2 nm and less than or equal to 10 nm. As the thickness of the film which releases oxygen by heat treatment gets larger, the amount of oxygen released is increased. However, when the thickness becomes too large, time needed for deposition is increased and productivity is reduced. Therefore, an appropriate thickness is employed. There is no limitation on the thickness of the YSZ film as long as a top surface of the YSZ film has sufficient crystallinity. However, the thickness of the YSZ film is preferably small such that at least part of the released oxygen from the silicon oxide film permeates the YSZ film.

To release oxygen by heat treatment means that the released amount of oxygen which is converted into oxygen atoms is estimated to be greater than or equal to $1.0 \times 10^{18}$ atoms/cm$^3$, or greater than or equal to $1.0 \times 10^{20}$ atoms/cm$^3$ in thermal desorption spectroscopy (TDS).

Here, a method to measure the amount of released oxygen using TDS analysis is described.

The total amount of the gas which is released at the time of IDS analysis is proportional to an integral value of the ion intensity of the released gas. Then, the integral value is compared with that of a reference sample, whereby the total amount of the released gas can be calculated.

For example, the number of the released oxygen molecules ($N_{O2}$) from an insulating film can be obtained according to Formula 7 with the TDS analysis results of a silicon wafer containing hydrogen at a predetermined density which is a standard sample and the TDS analysis results of the insulating film. Here, all gases having a mass number of 32 which are obtained in the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[Formula 7]}$$

$N_{H2}$ is the value obtained by conversion of the number of hydrogen molecules desorbed from the standard sample into densities. Sm is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. α is a coefficient affecting the ion intensity in the TDS analysis. Refer to Japanese Published Patent Application No. H6-275697 for details of Formula 7. Note that the amount of released oxygen from the insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$(X>2)). In the oxygen-excess silicon oxide (SiO$_X$(X>2)), the number of oxygen atoms per unit volume is more than twice the number of silicon atoms per unit volume. The number of silicon atoms and the number of oxygen atoms per unit volume are measured by Rutherford backscattering spectrometry (RBS).

By supplying oxygen from the underlayer film 102 to the oxide semiconductor film 106, the number of the interface state density between the oxide semiconductor film 106 and the underlayer film 102 can be reduced. As a result, carrier trapping at the interface between the oxide semiconductor film 106 and the underlayer film 102 through operation of the transistor or the like can be suppressed, and thus a transistor whose electrical characteristics less deteriorate can be obtained.

Further, in some cases, charge is generated due to oxygen deficiency in the oxide semiconductor film. In general, part of oxygen deficiency in an oxide semiconductor film serves as a donor and causes release of an electron which is a carrier. As a result, the threshold voltage of a transistor shifts in the negative direction. When oxygen is sufficiently supplied from the underlayer film 102 to the oxide semiconductor film 106, oxygen deficiency in the oxide semiconductor film which causes the negative shift of the threshold voltage can be reduced.

In other words, when the film from which oxygen is released by heat treatment is provided as the underlayer film 102, the interface state density at the interface between the oxide semiconductor film 106 and the underlayer film 102 and the oxygen deficiency in the oxide semiconductor film 106 can be reduced. Thus, the influence of carrier trapping at the interface between the oxide semiconductor film 106 and the underlayer film 102 can be reduced.

It is preferable that a surface of the substrate 100 over which the transistor is formed be planar. Specifically, Ra is less than or equal to 1 nm, preferably less than or equal to 0.3 nm. There is no particular limitation on a material of the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

A flexible substrate may alternatively be used as the substrate 100. In that case, a transistor may be formed directly over a flexible substrate. Note that as a method for forming a transistor over a flexible substrate, there is another method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The gate electrode 104 may be formed with a single layer or a stack of layers using one or more of the following materials: Al, Ti, Cr, Co, Ni, Cu, Y, Zr, Mo, Ag, Ta, and W; a nitride of any of these elements; an oxide of any of these elements; and an alloy of any of these elements.

Although, in FIGS. 8A to 8C, the gate electrode 104 does not completely cover the oxide semiconductor film 106, the gate electrode 104 may completely cover the oxide semiconductor film 106 in order to prevent degradation of the oxide semiconductor film 106 caused by light and generation of an electric charge in the oxide semiconductor film 106.

The pair of electrodes 116 functions as source and drain electrodes in response to the operation of the transistor.

The pair of electrodes 116 may be formed with a single layer or a stack of layers using a metal film, a metal nitride film, a metal oxide film, an alloy film, or the like given for the gate electrode 104.

When a film containing Cu is used for the pair of electrodes 116, the wiring resistance can be reduced, and wiring delay or the like can be prevented even in a large-sized display device or the like. In the case of using Cu for the pair of electrodes 116, the adhesion depends on the material of the substrate 100; therefore, it is preferable to employ a stacked-layer structure using a film having favorable adhesion property to the substrate 100. As the film having favorable adhesion property to the substrate 100, a film containing Ti, Mo, Mn, Cu, or Al may be used. For example, a Ti film, a titanium nitride film, a Ti—Mo alloy film, or a Cu—Mn—Al alloy film may be used.

The gate insulating film 112 may be formed with a single layer or a stack of layers using silicon nitride, aluminum oxide, hafnium oxide, yttrium oxide, zirconium oxide, YSZ, or the like. For example, the gate insulating film 112 may be formed by a plasma CVD method, a sputtering method, or the like. A film which releases oxygen by heat treatment is preferably used for the gate insulating film 112. With the use of such a film which releases oxygen by heat treatment, defects generated in the oxide semiconductor film 106 can be repaired and deterioration in electric characteristics of the transistor can be suppressed.

Note that a YSZ film is preferably used as the gate insulating film 112. Crystal growth of the YSZ film occurs and the YSZ film is formed over the oxide semiconductor film 106 which is the CAAC-OS, whereby the electron state of the interface between the oxide semiconductor film 106 and the gate insulating film 112 can become favorable. In the case where the gate insulating film 112 is formed with a stack of layers, the YSZ film is preferably provided in the gate insulating film 112 on the oxide semiconductor film 106 side.

As described above, the film containing zirconium oxide with the (111) plane alignment is used as the underlayer film 102, and the oxide semiconductor film 106 having the atomic arrangement with a low lattice mismatch factor with respect to the atomic arrangement of the underlayer film 102 is provided over the underlayer film 102, whereby the oxide semiconductor film 106 that is the CAAC-OS having a crystal region with a high degree of crystallinity can be formed directly on the underlayer film 102. Thus, stable electric characteristics are given to the transistor, so that a highly reliable semiconductor device can be manufactured.

Next, a method for manufacturing the transistor illustrated in FIGS. 8A to 8C is described with reference to FIGS. 2A to 2D.

Figure 2A:
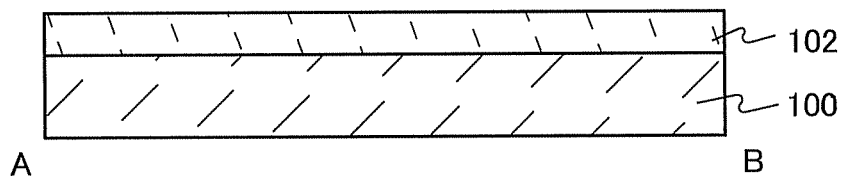
FIGS. 2A to 2D are cross-sectional views illustrating an example of a method for manufacturing a semiconductor device illustrated in FIGS. 8A to 8C.

First, the underlayer film 102 is formed over the substrate 100 (see FIG. 2A).

The substrate 100 has preferably high planarity because the underlayer film 102 can have higher crystallinity as the planarity of the substrate 100 is increased. Therefore, it is preferable that the substrate 100 be subjected to planarization treatment in advance. As the planarization treatment, chemical mechanical polishing (CMP) treatment, a reverse sputtering method, or the like may be used.

Here, a reverse sputtering method refers to the one in which ions collide with a surface to be processed so that the surface is modified, in contrast to normal sputtering in which ions collide with a sputtering target. As the method in which ions collide with a surface to be processed, for example, a method is given in which a high frequency voltage is applied to the surface to be processed in a rare gas (such a helium, neon, argon, krypton, or xenon) atmosphere to generate plasma in the vicinity of the surface. Note that, instead of a rare gas atmosphere, an atmosphere of nitrogen, oxygen, or the like may be used. The apparatus used for the sputtering method is not limited to a sputtering apparatus, and the same treatment can also be performed by a plasma CVD apparatus, a dry etching apparatus, or the like.

The underlayer film 102 may be deposited by a sputtering method, an MBE method, a PLD method, an ALD method, or the like. It is preferable to use a sputtering method.

A method for depositing the underlayer film 102 by a sputtering method is described below. The deposition can be performed by a reactive sputtering method using a target containing metallic zirconium and a deposition gas containing oxygen. Alternatively, the deposition may be performed using a target containing zirconium oxide and a deposition gas containing one or more kinds of a rare gas and oxygen. Here, when yttrium or yttrium oxide is contained in the target, a YSZ film can be deposited. Although calcium, magnesium, cerium, or aluminum may be contained instead of yttrium, only the YSZ film which is deposited using a target containing yttrium is described in this embodiment for convenience.

The underlayer film 102 contains zirconium oxide with the (111) plane alignment. Zirconium oxide itself has low thermal stability, and the crystal state thereof can be stabilized by containing a stabilizing material such as yttrium in zirconium oxide.

In order to deposit a YSZ film so that the (111) plane alignment is strongly obtained, it is important to increase the deposition power, reduce the deposition pressure, reduce a distance between the target and the substrate (T-S distance), and increase a substrate surface temperature (Tsub) at the deposition. These are performed in order to increase the energy of a sputtered particle which flies onto the surface of the substrate from the target owing to a sputtering phenomenon. In other words, high-energy sputtered particles migrate after reaching the surface of the substrate, so that the crystallinity of the resulting film can be improved.

Specifically, a deposition power per unit area is set to greater than or equal to 5 W/cm$^2$ and less than or equal to 50 W/cm$^2$. As the deposition power becomes higher, the crystallinity of the resulting film tends to be increased; however, when the deposition power is too high, abnormal discharge might occur and the target might crack. Note that as a power source for the sputtering, a DC power source, an AC power source, or an RF power source can be used, and an RF power source is preferably used. In the case where an RF power source is used, a target having a high insulating property (e.g., a metal oxide target) can be used, and the uniformity of film quality within the surface of the substrate can be increased, so that the planarity of the surface of the film can be further improved.

In addition, the deposition pressure is set to greater than or equal to 0.01 Pa and less than or equal to 0.4 Pa, preferably greater than or equal to 0.05 Pa and less than or equal to 0.3 Pa. As the deposition pressure becomes lower, the crystallinity of the resulting film tends to be increased; however, when the deposition pressure is too low, plasma which is needed for the sputtering cannot be formed. In addition, when the deposition pressure is too low, damage to the film might be caused by recoil ions.

Further, the T-S distance is set to greater than or equal to 10 mm and less than or equal to 200 mm, preferably greater than or equal to 20 mm and less than or equal to 80 mm. As the T-S distance becomes shorter, the crystallinity of the resulting film tends to be increased; however, when the T-S distance is too short, plasma which is needed for the sputtering cannot be formed. In addition, when the T-S distance is too short, the film quality and the film-thickness distribution within the surface of the substrate cannot be uniformed in some cases.

Furthermore, Tsub is set to higher than or equal to 100° C. and lower than or equal to 500° C., preferably higher than or equal to 150° C. and lower than or equal to 450° C. As Tsub becomes higher, the crystallinity of the resulting film tends to be increased; however, when Tsub is too high, the crystal system and crystal direction of the zirconium oxide are changed. In addition, when Tsub is too high (e.g., higher than 500° C.), the crystal state is broken, so that a film containing zirconium oxide having a cubic crystal structure cannot be obtained.

After the deposition of the underlayer film 102, first heat treatment is preferably performed to further increase the crystallinity of the underlayer film 102. The first heat treatment is preferably performed in an oxidation atmosphere, an inert atmosphere, a reduced-pressure atmosphere, or a dry-air atmosphere at a temperature higher than or equal to 150° C. and lower than or equal to 650° C., preferably higher than or equal to 250° C. and lower than or equal to 500° C., more preferably higher than or equal to 300° C. and lower than or equal to 450° C. A resistance heating method, a method using a lamp heater, a method using a heated gas, or the like may be used in the first heat treatment. Note that when the temperature of the heat treatment is too high (e.g., higher than 650° C.), the crystal structure, on the contrary, is broken, so that a film containing zirconium oxide having a cubic crystal structure cannot be obtained.

Note that an oxidation atmosphere refers to an atmosphere containing an oxidation gas. Oxidation gas is oxygen, ozone, nitrous oxide, or the like, and it is preferable that the oxidation gas does not contain water, hydrogen, and the like. For example, the purity of oxygen, ozone, or nitrous oxide to be introduced to a heat treatment apparatus is greater than or equal to 8N (99.999999%), preferably greater than or equal to 9N (99.9999999%). The oxidation atmosphere may contain a mixed gas of an oxidation gas and an inert gas. In that case, the atmosphere contains an oxidizing gas at a concentration of at least higher than or equal to 10 ppm.

The inert atmosphere contains an inert gas such as nitrogen or a rare gas as its main component. Specifically, in an inert atmosphere, the concentration of a reactive gas such as an oxidation gas is lower than 10 ppm.

In a reduced-pressure atmosphere, a pressure of a treatment chamber is lower than or equal to 10 Pa.

In a dry air atmosphere, a dew point is lower than or equal to −40° C., preferably lower than or equal to −50° C.

Here, in the case where the planarity of the underlayer film 102 is not sufficient, planarization treatment may be performed in a manner similar to that for the substrate 100.

Figure 2B:
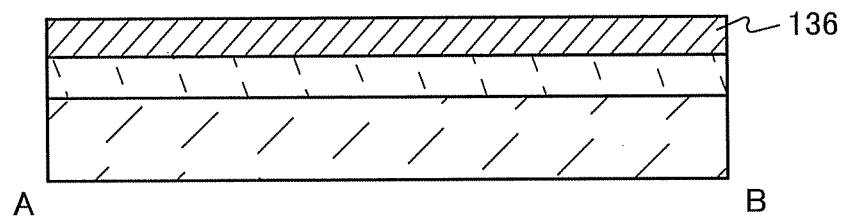

Next, an oxide semiconductor film 136 is deposited (see FIG. 2B). The oxide semiconductor film 136 may be deposited by a sputtering method, an MBE method, a PLD method, an ALD method, or the like. It is preferable to use a sputtering method.

A method for depositing the oxide semiconductor film 136 by a sputtering method is described below. For example, the deposition is performed using a target containing the above-described material, which is applicable to the oxide semiconductor film 106, and a deposition gas containing one or more kinds of a rare gas, nitrogen, and oxygen.

In order that the oxide semiconductor film 136 becomes a CAAC-OS which includes a crystal region with a high degree of crystallinity and is provided directly on the underlayer film 102, after the crystallinity and planarity of the underlayer film 102 are sufficiently increased, the deposition is performed by a method similar to that for increasing the crystallinity of the underlayer film 102. In short, it is important to increase the deposition power, reduce the deposition pressure, reduce the T-S distance, and increase Tsub.

Specifically, a deposition power per unit area is set to greater than or equal to 5 W/cm$^2$ and less than or equal to 50 W/cm$^2$; the deposition pressure is set to greater than or equal to 0.01 Pa and less than or equal to 0.4 Pa, preferably greater than or equal to 0.05 Pa and less than or equal to 0.3 Pa; the T-S distance is set to greater than or equal to 10 mm and less than or equal to 200 mm, preferably greater than or equal to 20 mm and less than or equal to 80 mm; Tsub is set to higher than or equal to 100° C. and lower than or equal to 500° C., preferably higher than or equal to 150° C. and lower than or equal to 450° C.

After the deposition of the oxide semiconductor film 136, it is preferable to perform second heat treatment because the degree of crystallinity of CAAC-OS is increased. The second heat treatment can be performed in a manner similar to the first heat treatment.

Through the above steps, the oxide semiconductor film 136 which is the CAAC-OS film can be formed directly on the underlayer film 102.

Figure 2C:
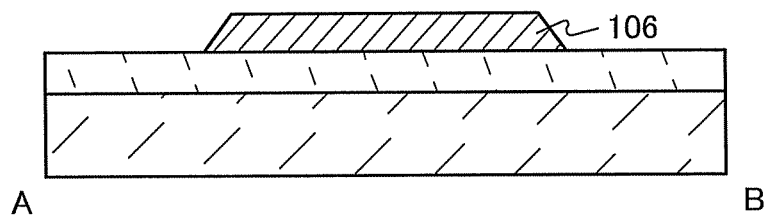

Next, the oxide semiconductor film 136 is processed to form the island-shaped oxide semiconductor film 106 (see FIG. 2C). Note that the expression "processing" means per-forming etching treatment using a resist mask formed by a photolithography method to obtain a film having a desired shape.

Next, a conductive film is deposited over the oxide semiconductor film 106 and is processed to form the pair of electrodes 116 which is at least partly in contact with the oxide semiconductor film 106. Then, the gate insulating film 112 is deposited over the oxide semiconductor film 106 and the pair of electrodes 116. The conductive film to be the pair of electrodes 116 and the gate insulating film 112 can be deposited using the above material by a sputtering method, a plasma CVD method, a PLD method, an ALD method, an evaporation method, a printing method, or the like. Note that in the case where a YSZ film is used as the gate insulating film 112, the gate insulating film 112 is preferably deposited by a method similar to that of the underlayer film 102 in order that crystal growth occurs from the interface between the gate insulating film 112 and the oxide semiconductor film 106.

Figure 2D:
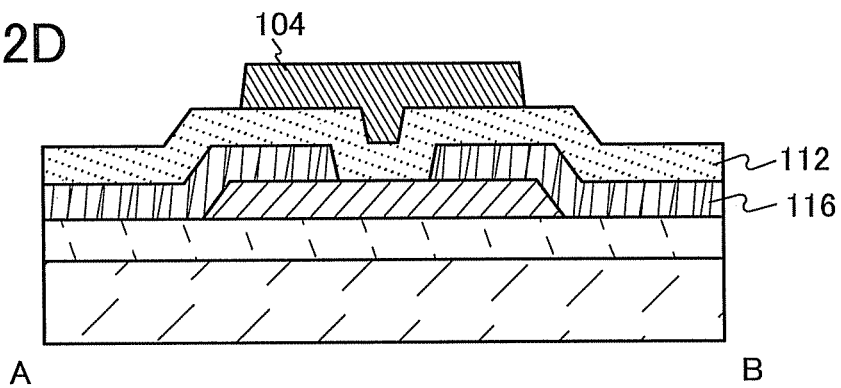

Next, a conductive film is deposited over the gate insulating film 112 and is processed to form the gate electrode 104 overlapping with the oxide semiconductor film 106 (see FIG. 2D). The conductive film to be the gate electrode 104 can be deposited using the above-described material by a sputtering method, a plasma CVD method, a PLD method, an ALD method, an evaporation method, a printing method, or the like.

As described above, the oxide semiconductor film 106 including a crystal region having a high degree of crystallinity can be formed directly on the underlayer film 102. Accordingly, the electron state of the interface between the underlayer film 102 and the oxide semiconductor film 106 becomes favorable, so that a highly reliable semiconductor device having stable electric characteristics can be manufactured.

Through the above-described process, the transistor illustrated in FIGS. 8A to 8C can be manufactured.

Next, a transistor having a structure different from that of the transistor illustrated in FIGS. 8A to 8C is described with reference to FIGS. 9A to 9C.

Figure 9A:
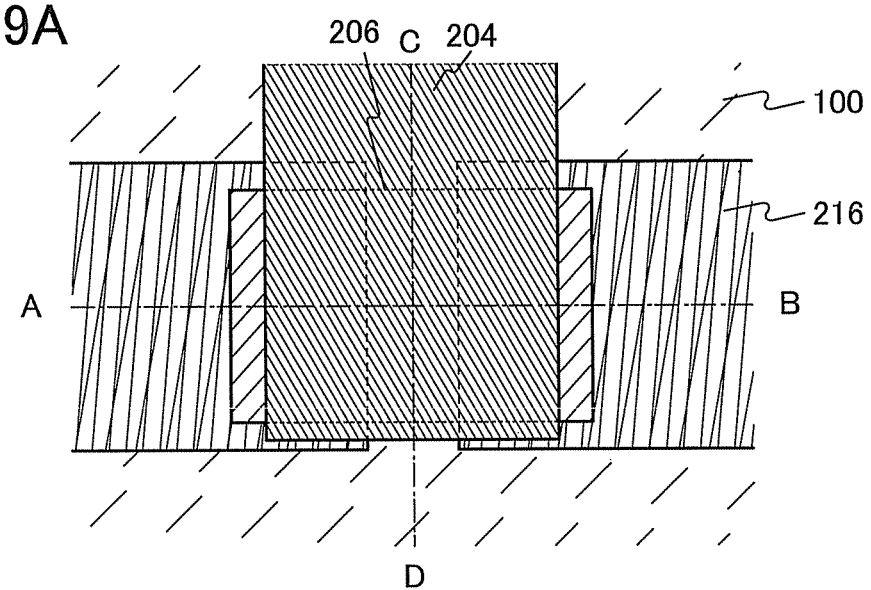
FIGS. 9A to 9C are a top view and cross-sectional views illustrating an example of a semiconductor device according to one embodiment of the present invention.
Figure 9B:
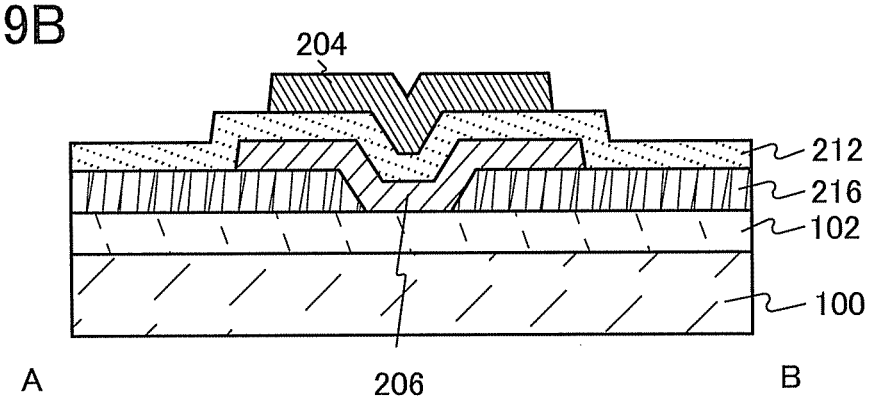
Figure 9C:
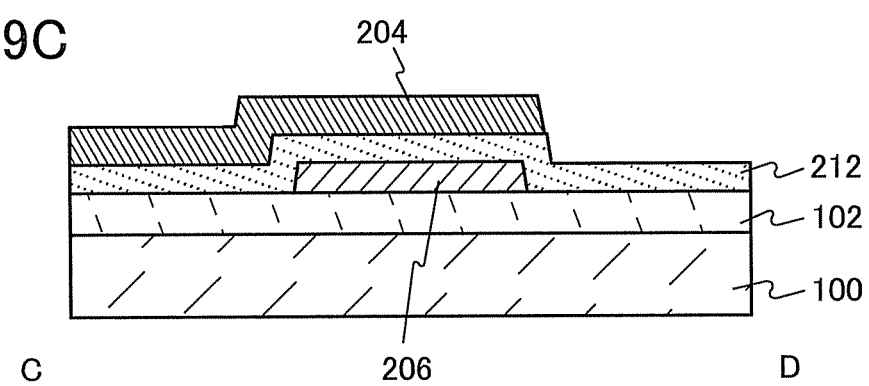

FIGS. 9A to 9C are a top view and cross-sectional views of the transistor. A cross section taken along dashed-dotted line A-B in FIG. 9A and a cross section taken along dashed-dotted line C-D in FIG. 9A correspond to a cross section A-B in FIG. 9B and a cross section C-D in FIG. 9C, respectively.

The cross section A-B in FIG. 9B is described in detail below.

The transistor illustrated in FIGS. 9A to 9C includes the substrate 100, the underlayer film 102 over the substrate 100, a pair of electrodes 216 over the underlayer film 102, an oxide semiconductor film 206 which is positioned over the pair of electrodes 216 and is at least partly in contact with the pair of electrodes 216, a gate insulating film 212 over the oxide semiconductor film 206 and the pair of electrodes 216, and a gate electrode 204 which overlaps with the oxide semiconductor film 206 with the gate insulating film 212 provided therebetween.

Note that, the pair of electrodes 216, the oxide semiconductor film 206, the gate insulating film 212, and the gate electrode 204 may be formed using methods and materials similar to those of the pair of electrodes 116, the oxide semiconductor film 106, the gate insulating film 112, and the gate electrode 104, respectively.

Although, in FIGS. 9A to 9C, the gate electrode 204 does not completely cover the oxide semiconductor film 206, the gate electrode 204 may completely cover the oxide semiconductor film 206 in order to prevent light from causing degradation of the oxide semiconductor film 206 and generation of an electric charge in the oxide semiconductor film 206.

Next, a method for manufacturing the transistor illustrated in FIGS. 9A to 9C is described with reference to FIGS. 3A to 3D.

First, the underlayer film 102 is formed over the substrate 100. Then, the pair of electrodes 216 is Banned over the underlayer film 102 (see FIG. 3A).

Figure 3A:
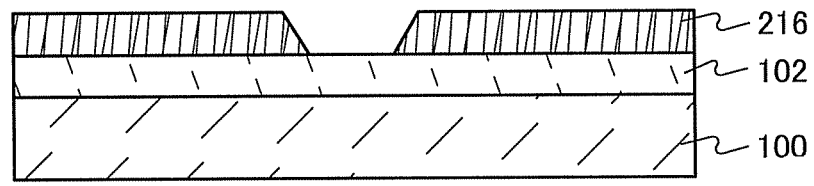
FIGS. 3A to 3D are cross-sectional views illustrating an example of a method for manufacturing a semiconductor device illustrated in FIGS. 9A to 9C.
Figure 3B:
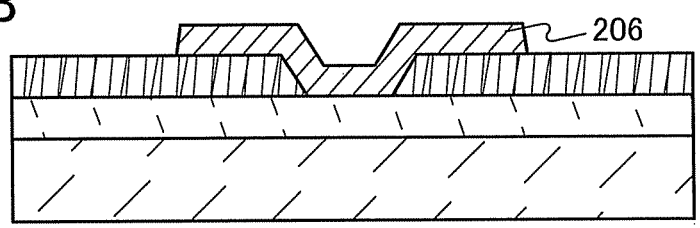

Next, the oxide semiconductor film 206 which is positioned over the pair of electrodes 216 and is at least partly in contact with the pair of electrodes 216 is formed (see FIG. 3B).

Figure 3C:
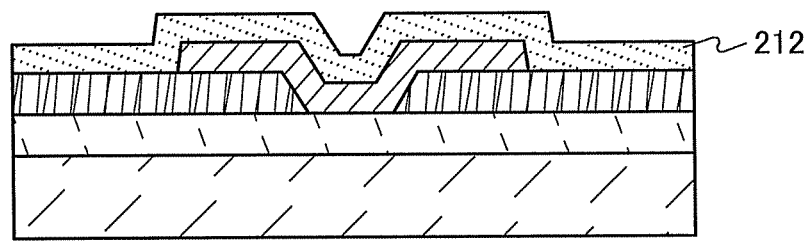

Next, the gate insulating film 212 is deposited over the oxide semiconductor film 206 and the pair of electrodes 216 (see FIG. 3C).

Figure 3D:
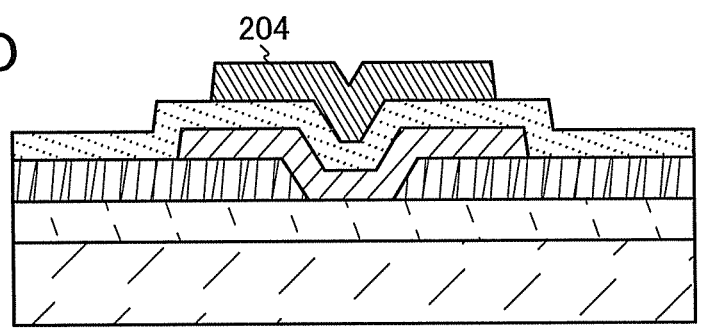
Figure 4A:
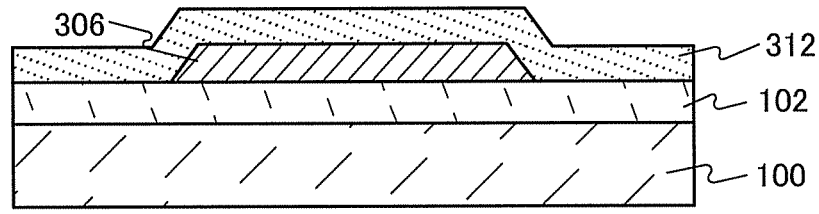
FIGS. 4A to 4D are cross-sectional views illustrating an example of a method for manufacturing a semiconductor device illustrated in FIGS. 10A to 10C.
Figure 4B:
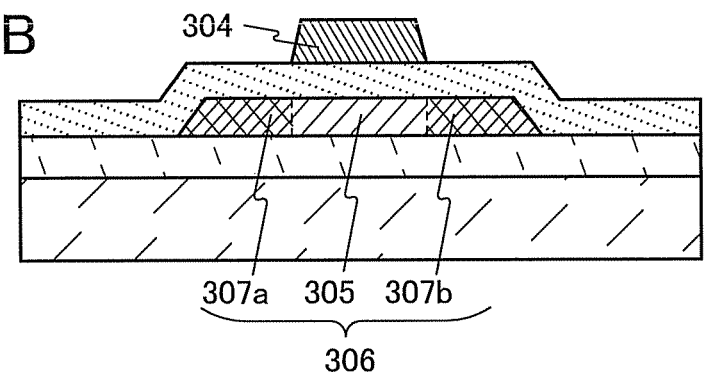
Figure 4C:
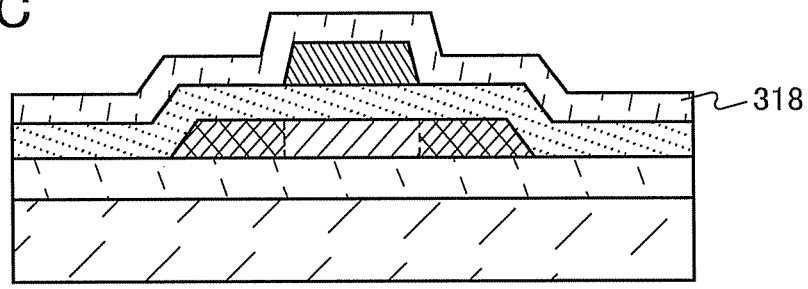
Figure 4D:
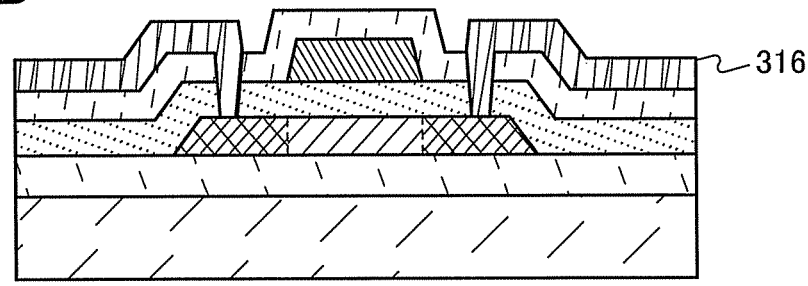

Next, the gate electrode 204 overlapping with the oxide semiconductor film 206 with the gate insulating film 212 provided therebetween is formed (see FIG. 3D).

As described above, the oxide semiconductor film 206 including a crystal region having a high degree of crystallinity can be formed directly on the underlayer film 102. Accordingly, the electron state of the interface between the underlayer film 102 and the oxide semiconductor film 206 becomes favorable, so that a highly reliable semiconductor device having stable electric characteristics can be manufactured.

Through the above steps, the transistor illustrated in FIGS. 9A to 9C can be manufactured.

Next, a transistor having a structure different from the structures of the transistors in FIGS. 8A to 8C and FIGS. 9A to 9C is described with reference to FIGS. 10A to 10C.

Figure 10A:
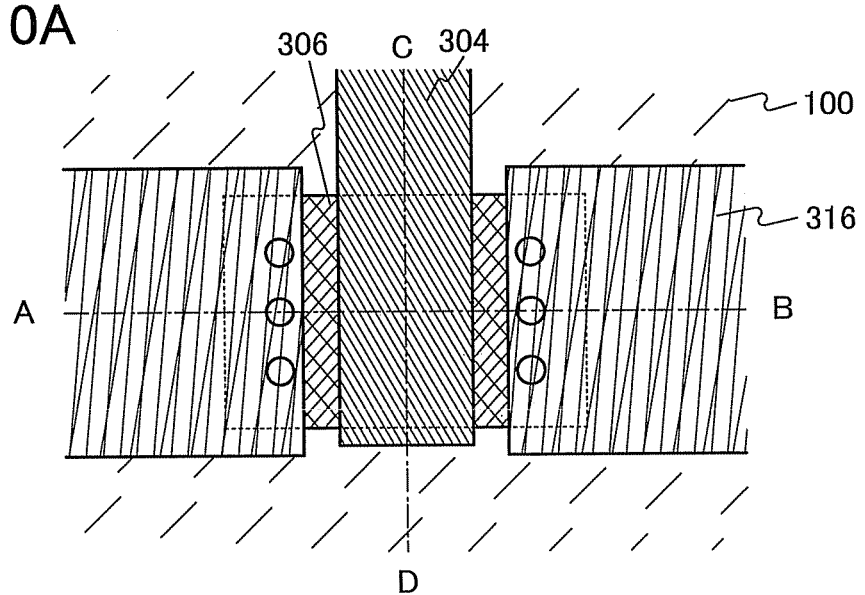
FIGS. 10A to 10C are a top view and cross-sectional views illustrating an example of a semiconductor device according to one embodiment of the present invention.
Figure 10B:
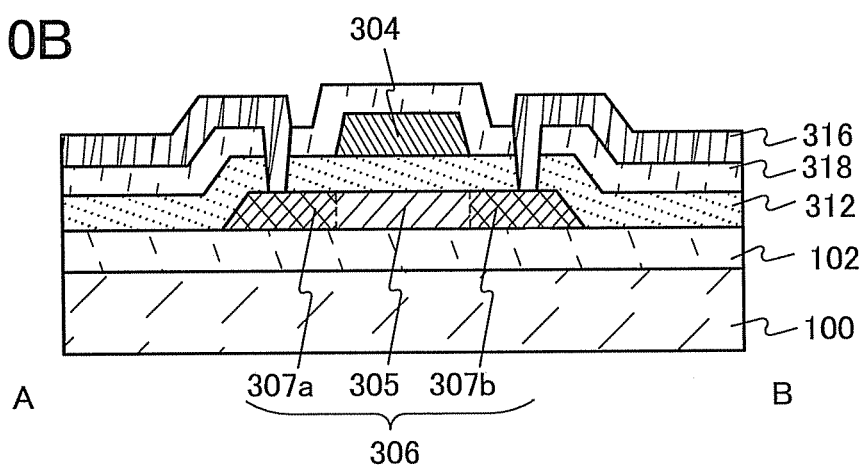
Figure 10C:
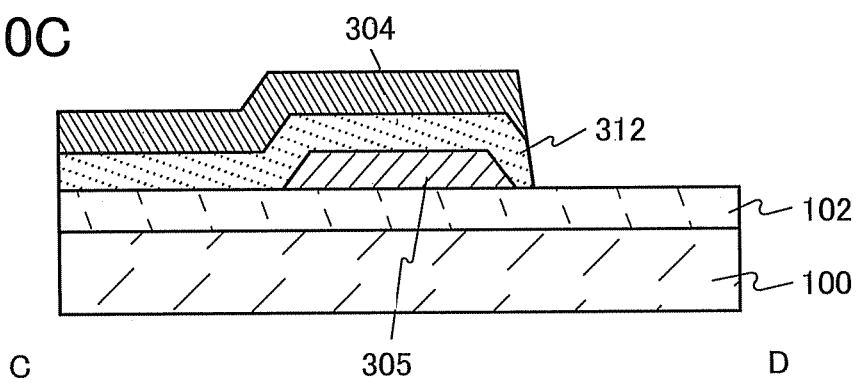

FIGS. 10A to 10C are a top view and cross-sectional views of the transistor. A cross section taken along dashed-dotted line A-B in FIG. 10A and a cross section taken along dashed-dotted line C-D in FIG. 10A correspond to a cross section A-B in FIG. 10B and a cross section C-D in FIG. 10C, respectively.

The cross section A-B in FIG. 10B is described below in detail.

The transistor illustrated in FIGS. 10A to 10C includes the substrate 100; the underlayer film 102 over the substrate 100; an oxide semiconductor film 306 which is positioned over the underlayer film 102 and includes a channel region 305, a source region 307a, and a drain region 307b; a gate insulating film 312 over the oxide semiconductor film 306 and the underlayer film 102; a gate electrode 304 which overlaps with the oxide semiconductor film 306 with the gate insulating film 312 provided therebetween; a protective film 318 over the gate electrode 304 and the gate insulating film 312; and a pair of electrodes 316 which is positioned over the protective film 318 and in contact with the source region 307a and the drain region 307b through openings formed in the gate insulating film 312 and the protective film 318.

Note that, the pair of electrodes 316, the oxide semiconductor film 306, the gate electrode 304, and the gate insulating film 312 may be formed using methods and materials similar to those of the pair of electrodes 116, the oxide semiconductor film 106, the gate electrode 104, and the gate insulating film 112, respectively.

Although, in FIGS. 10A to 10C, the shape of each of the openings provided in the gate insulating film 312 and the protective film 318 is a circle when seen from the top surface, one embodiment of the present invention is not limited to this shape. There is no particular limitation on the shape of each of the openings as long as the source region 307a and the drain region 307b are exposed through the respective openings.

The channel region 305 and the gate electrode 304 may have substantially the same shape when seen from the top surface. Note that the source region 307a and the drain region 307b include nitrogen, phosphorus, boron, hydrogen, a rare gas, or the like.

Note that although the names such as "channel region", "source region" and "drain region" are used for convenience, when the transistor does not operate, the channel region 305 is a high-resistance region, and the source region 307a and the drain region 307b are low-resistance regions.

Since the transistor includes the source region 307a and the drain region 307b, an electric-field concentration can be relieved as compared to a structure in which a source electrode and a drain electrode are directly in contact with a channel region, and thus the degradation of the transistor, such as hot carrier degradation, can be reduced.

Further, since the transistor includes the source region 307a and the drain region 307b, influence of the electric field spreading from the drain side toward the source side can be reduced. Therefore, the negative shift of the threshold voltage which is caused due to a short channel length, i.e., a so-called short-channel effect can be suppressed.

Next, a method for manufacturing the transistor illustrated in FIGS. 10A to 10C is described with reference to FIGS. 4A to 4D.

First, the underlayer film 102 is formed over the substrate 100. Then, the oxide semiconductor film 306 is formed over the underlayer film 102. Then, the gate insulating film 312 is deposited over the oxide semiconductor film 306 and the underlayer film 102 (see FIG. 4A).

Next, the gate electrode 304 overlapping with the oxide semiconductor film 306 with the gate insulating film 312 provided therebetween is formed. Then, with the use of the gate electrode 304 as a mask, ions of nitrogen, phosphorus, boron, hydrogen, or a rare gas are added to part of the oxide semiconductor film 306. Only the addition of ions, or both the addition of ions and heat treatment are performed, so that the resistance of a region of the oxide semiconductor film 306 to which the ions are added is reduced, whereby the channel region 305, the source region 307a, and the drain region 307b are formed. Note that the channel region 305 is a region whose resistance is not reduced by the addition of ions (see FIG. 4B).

Next, the protective film 318 is formed over the oxide semiconductor film 306 and the gate electrode 304 (see FIG. 4C), and openings from which the source region 307a and the drain region 307b are exposed are formed in the gate insulating film 312 and the protective film 318. Then, the pair of electrodes 316 which is in contact with the oxide semiconductor film 306 is formed (see FIG. 4D). Note that instead of the heat treatment for forming the source region 307a and the drain region 307b, heat treatment may be performed after formation of the protective film 318 or formation of the pair of electrodes 316.

As described above, the oxide semiconductor film 306 including a crystal region having a high degree of crystallinity can be formed directly on the underlayer film 102. Accordingly, the electron state of the interface between the underlayer film 102 and the oxide semiconductor film 306 becomes favorable, so that a highly reliable semiconductor device having stable electric characteristics can be manufactured. Note that crystals of the source region 307a and the drain region 307b in the oxide semiconductor film 306 might be broken due to damage by the addition of ions. In the transistor according to one embodiment of the present invention, at least the channel region 305 is a CAAC-OS. Breaking a crystal represents reducing the crystallinity of the crystal or making the crystal amorphous.

Through the above steps, the transistor illustrated in FIGS. 10A to 10C can be manufactured.

Next, a transistor having a structure different from the structures of the transistors in FIGS. 8A to 8C, FIGS. 9A to 9C, and FIGS. 10A to 10C is described with reference to FIGS. 11A to 11C.

Figure 11A:
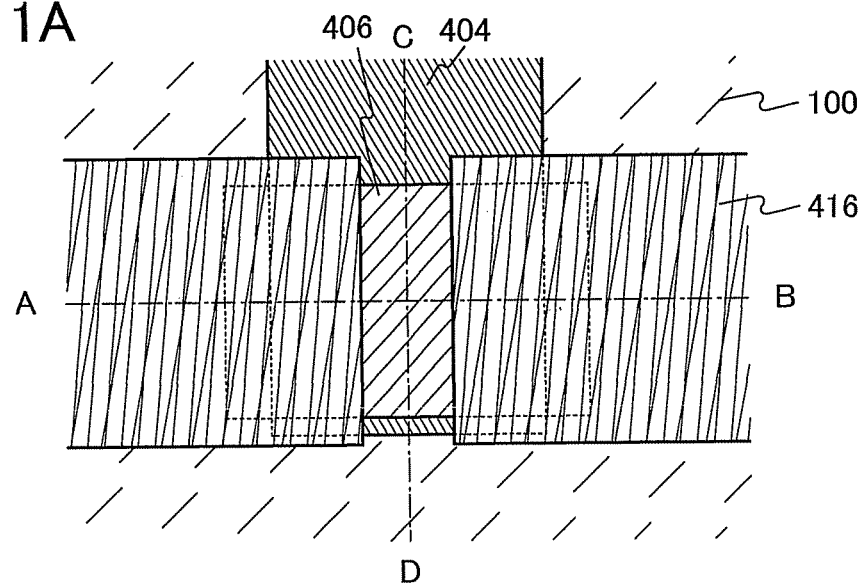
FIGS. 11A to 11C are a top view and cross-sectional views illustrating an example of a semiconductor device according to one embodiment of the present invention.
Figure 11B:
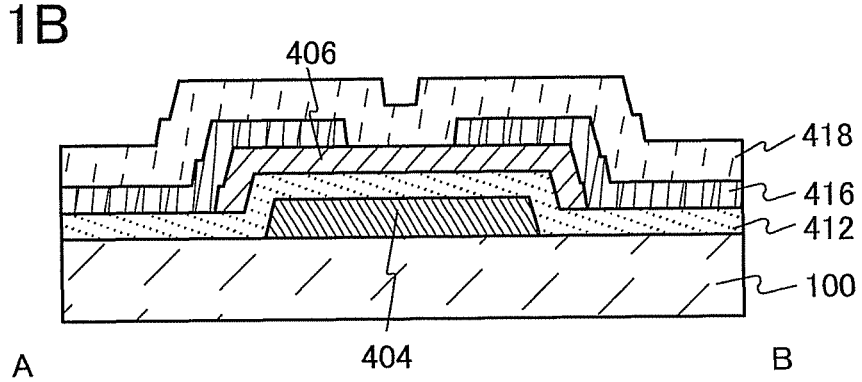
Figure 11C:
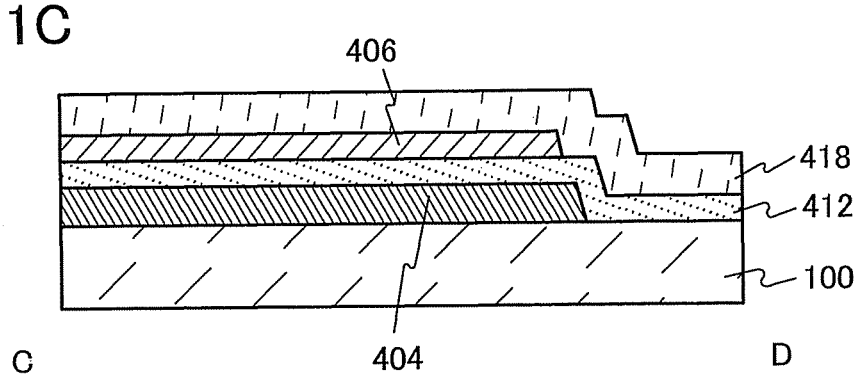

FIGS. 11A to 11C are a top view and cross-sectional views of the transistor. A cross section taken along dashed-dotted line A-B in FIG. 11A and a cross section taken along dashed-dotted line C-D in FIG. 11A correspond to a cross section A-B in FIG. 11B and a cross section C-D in FIG. 11C, respectively.

The cross section A-B in FIG. 11B is described below in detail.

The transistor illustrated in FIGS. 11A to 11C includes the substrate 100, a gate electrode 404 over the substrate 100, a gate insulating film 412 covering the gate electrode 404, an oxide semiconductor film 406 which overlaps with the gate electrode 404 with the gate insulating film 412 provided therebetween, a pair of electrodes 416 which is positioned over the oxide semiconductor film 406 and is at least partly in contact with the oxide semiconductor film 406, and a protective film 418 over the oxide semiconductor film 406 and the pair of electrodes 416.

Note that, the gate electrode 404, the oxide semiconductor film 406, and the pair of electrodes 416 may be formed using methods and materials similar to those of the gate electrode 104, the oxide semiconductor film 106, and the pair of electrodes 116, respectively.

In this structure, the gate insulating film 412 serves as a base of the oxide semiconductor film 406. Therefore, the gate insulating film 412 is formed using a method and a material similar to those of the underlayer film 102. Accordingly, the oxide semiconductor film 406 which is the CAAC-OS including a crystal region having a high degree of crystallinity can be formed directly on the gate insulating film 412.

The protective film 418 is formed using a method and a material similar to those of the gate insulating film 112.

It is preferable that the protective film 418 have low relative permittivity and a sufficient thickness. For example, a silicon oxide film having a relative permittivity of 3.8 and a thickness of greater than or equal to 300 nm and less than or equal to 1000 nm may be used. A surface of the protective film 418 has a little fixed charge because of influence of atmospheric components and the like, which might cause the shift of the threshold voltage of the transistor. Therefore, it is preferable that the protective film 418 have relative permittivity and a thickness such that the influence of the fixed charge at the surface is sufficiently reduced. For the same reason, a resin film may be formed over the protective film 418 to reduce the influence of the fixed charge.

Although, in FIGS. 11A to 11C, the gate electrode 404 does not completely cover the oxide semiconductor film 406, the gate electrode 404 may completely cover the oxide semiconductor film 406 in order to prevent light from causing degradation of the oxide semiconductor film 406 and generation of an electric charge in the oxide semiconductor film 406.

Next, a method for manufacturing the transistor illustrated in FIGS. 11A to 11C is described with reference to FIGS. 5A to 5D.

First, the gate electrode 404 is formed over the substrate 100. Next, the gate insulating film 412 is deposited to cover the gate electrode 404 (see FIG. 5A).

Figure 5A:
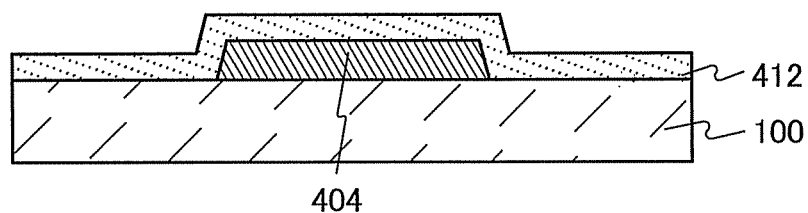
FIGS. 5A to 5D are cross-sectional views illustrating an example of a method for manufacturing a semiconductor device illustrated in FIGS. 11A to 11C.
Figure 5B:
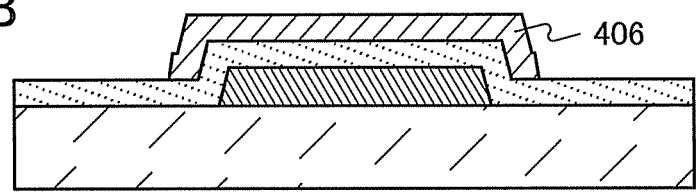

Next, the oxide semiconductor film 406 overlapping with the gate electrode 404 with the gate insulating film 412 provided therebetween is formed (see FIG. 5B).

Figure 5C:
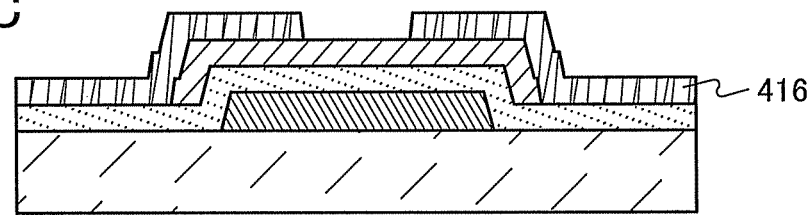

Next, the pair of electrodes 416 which is positioned over the oxide semiconductor film 406 and is at least partly in contact with the oxide semiconductor film 406 is formed (see FIG. 5C).

Figure 5D:
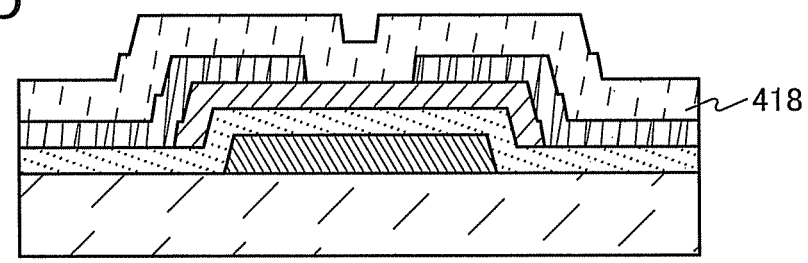

Next, the protective film 418 is formed over the oxide semiconductor film 406 and the pair of electrodes 416 (see FIG. 5D).

As described above, the oxide semiconductor film 406 including a crystal region having a high degree of crystallinity can be formed directly on the gate insulating film 412. Accordingly, the electron state of the interface between the gate insulating film 412 and the oxide semiconductor film 406 becomes favorable, so that a highly reliable semiconductor device having stable electric characteristics can be manufactured.

Through the above steps, the transistor illustrated in FIGS. 11A to 11C can be manufactured.

Next, a transistor having a structure different from the structures of the transistors in FIGS. 8A to 8C, FIGS. 9A to 9C, FIGS. 10A to 10C, and FIGS. 11A to 11C is described with reference to FIGS. 12A to 12C.

Figure 12A:
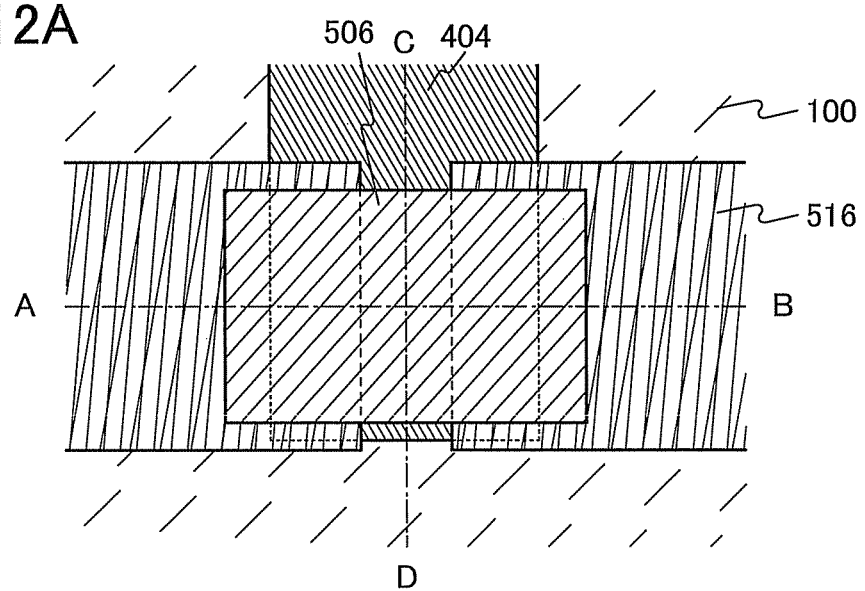
FIGS. 12A to 12C are a top view and cross-sectional views illustrating an example of a semiconductor device according to one embodiment of the present invention.
Figure 12B:
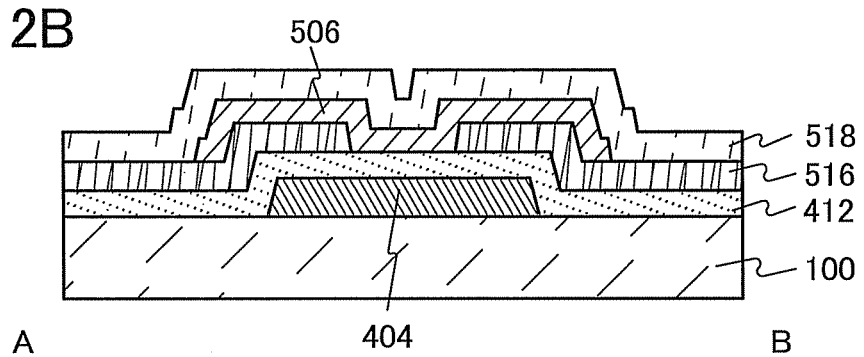
Figure 12C:
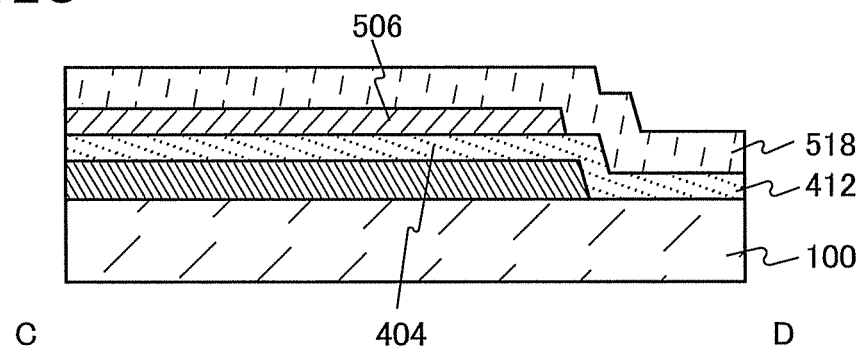

FIGS. 12A to 12C are a top view and cross-sectional views of the transistor that is a semiconductor device according to one embodiment of the present invention. A cross section taken along dashed-dotted line A-B in FIG. 12A and a cross section taken along dashed-dotted line C-D in FIG. 12A correspond to a cross section A-B in FIG. 12B and a cross section C-D in FIG. 12C, respectively.

The cross section A-B in FIG. 12B is described below in detail.

The transistor illustrated in FIGS. 12A to 12C includes the substrate 100, the gate electrode 404 over the substrate 100, the gate insulating film 412 covering the gate electrode 404, a pair of electrodes 516 over the gate insulating film 412, an oxide semiconductor film 506 which is at least partly in contact with the pair of electrodes 516 and overlaps with the gate electrode 404 with the gate insulating film 412 provided therebetween, and a protective film 518 over the oxide semiconductor film 506 and the pair of electrodes 516.

Note that the oxide semiconductor film 506, the pair of electrodes 516, and the protective film 518 may be formed using methods and materials similar to those of the oxide semiconductor film 106, the pair of electrodes 116, and the protective film 418, respectively.

Although, in FIGS. 12A to 12C, the gate electrode 404 does not completely cover the oxide semiconductor film 506, the gate electrode 404 may completely cover the oxide semiconductor film 506 in order to prevent degradation of the oxide semiconductor film 506 caused by light and generation of an electric charge in the oxide semiconductor film 506.

Figure 6A:
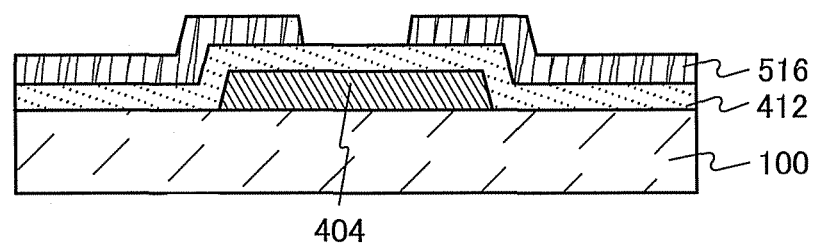
FIGS. 6A to 6C are cross-sectional views illustrating an example of a method for manufacturing a semiconductor device illustrated in FIGS. 12A to 12C.

Next, a method for manufacturing the transistor illustrated in FIGS. 12A to 12C is described with reference to FIGS. 6A to 6C.

First, the gate electrode 404 is formed over the substrate 100. Next, the gate insulating film 412 is deposited to cover the gate electrode 404. Then, the pair of electrodes 516 is formed over the gate insulating film 412 (see FIG. 6A).

Figure 6B:
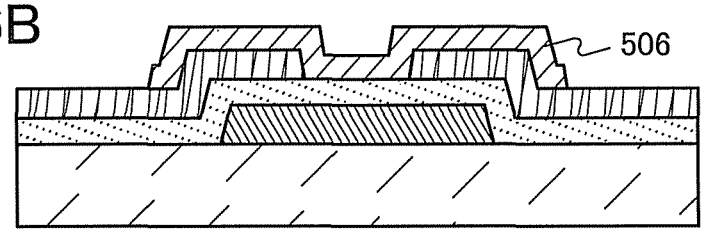

Next, the oxide semiconductor film 506 which overlaps with the gate electrode 404 with the gate insulating film 412 provided therebetween and is at least partly in contact with the pair of electrodes 516 is formed (see FIG. 6B).

Figure 6C:
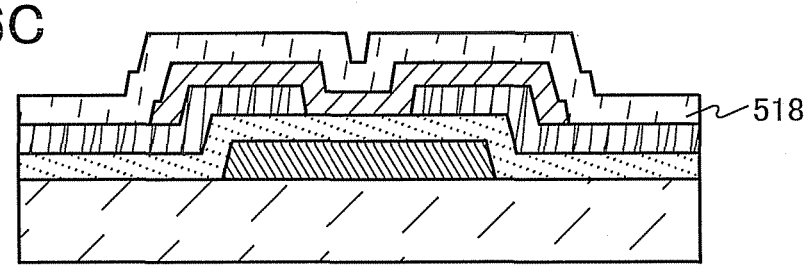

Next, the protective film 518 is formed over the oxide semiconductor film 506 and the pair of electrodes 516 (see FIG. 6C).

As described above, the oxide semiconductor film 506 including a crystal region having a high degree of crystallinity can be formed directly on the gate insulating film 412. Accordingly, the electron state of the interface between the gate insulating film 412 and the oxide semiconductor film 506 becomes favorable, so that a highly reliable semiconductor device having stable electric characteristics can be manufactured.

Through the above steps, the transistor illustrated in FIGS. 12A to 12C can be manufactured.

Next, a transistor having a structure different from the structures of the transistors in FIGS. 8A to 8C, FIGS. 9A to 9C, FIGS. 10A to 10C, FIGS. 11A to 11C, and FIGS. 12A to 12C is described with reference to FIGS. 13A to 13C.

Figure 13A:
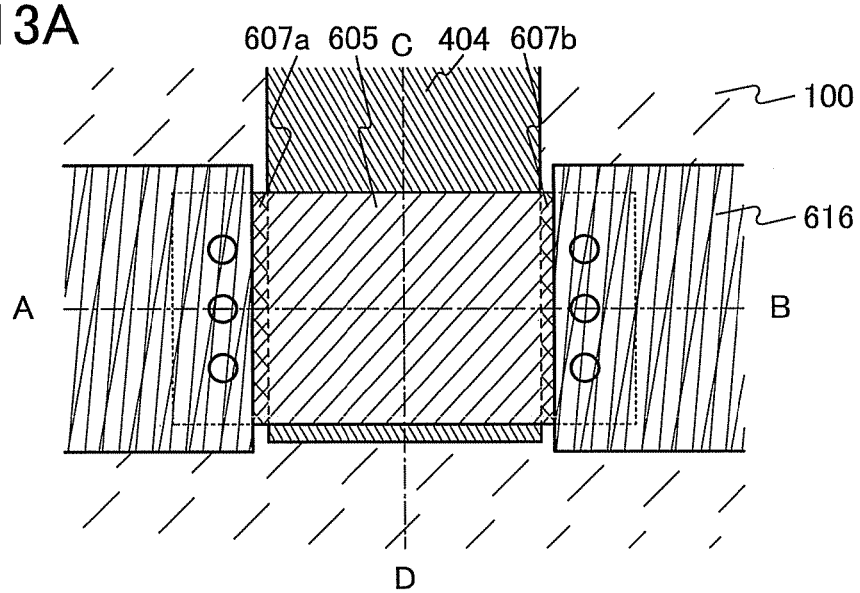
FIGS. 13A to 13C are a top view and cross-sectional views illustrating an example of a semiconductor device according to one embodiment of the present invention.
Figure 13B:
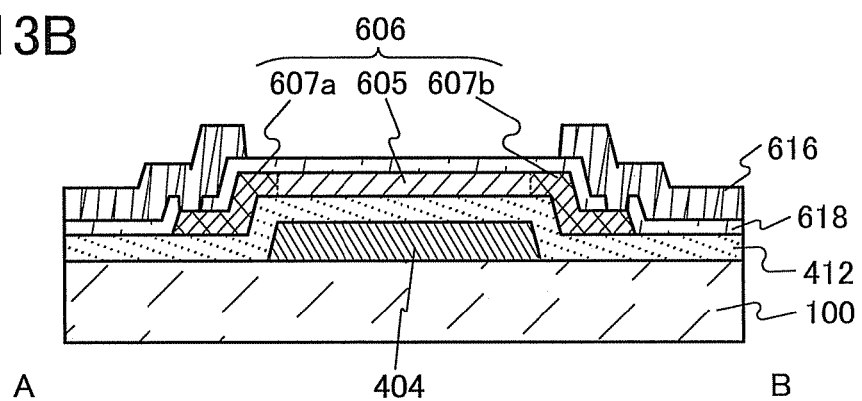
Figure 13C:
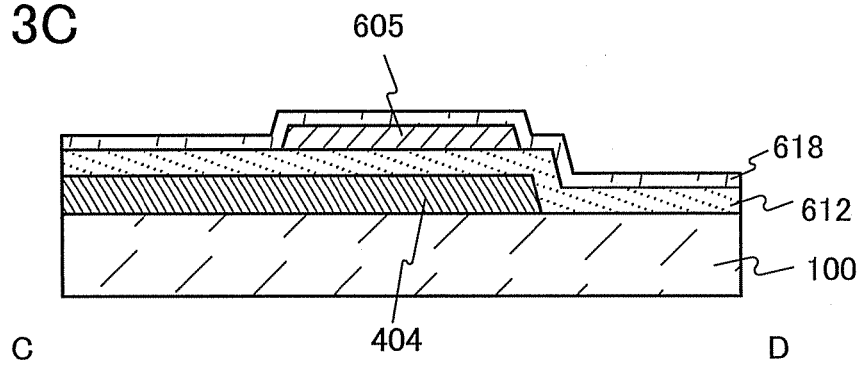

FIGS. 13A to 13C are a top view and cross-sectional views of the transistor. A cross section taken along dashed-dotted line A-B in FIG. 13A and a cross section taken along dashed-dotted line C-D in FIG. 13A correspond to a cross section A-B in FIG. 13B and a cross section C-D in FIG. 13C, respectively.

The cross section A-B in FIG. 13B is described below in detail.

The transistor illustrated in FIGS. 13A to 13C includes the substrate 100, the gate electrode 404 over the substrate 100, the gate insulating film 412 covering the gate electrode 404, an oxide semiconductor film 606 which is positioned over the gate electrode 404 with the gate insulating film 412 provided therebetween and includes a channel region 605, a source region 607a, and a drain region 607b, a protective film 618 over the oxide semiconductor film 606 and the gate insulating film 412, and a pair of electrodes 616 which is positioned over the protective film 618 and is in contact with the source region 607a and the drain region 607b through openings provided in the gate insulating film 412 and the protective film 618.

Note that the pair of electrodes 616, the oxide semiconductor film 606, and the protective film 618 may be formed using methods and materials similar to those of the pair of electrodes 116, the oxide semiconductor film 106, and the protective film 418, respectively.

Although, in FIGS. 13A to 13C, the gate electrode 404 and the channel region 605 have substantially the same shape seen from the top surface, one embodiment of the present invention is not limited to this shape. The gate electrode 404 and the channel region 605 may have different shapes from each other.

Note that the source region 607a and the drain region 607b include nitrogen, phosphorus, boron, hydrogen, a rare gas, or the like.

Note that although the names such as "channel region", "source region" and "drain region" are used for convenience, when the transistor does not operate, the channel region 605 is a high-resistance region, and the source region 607a and the drain region 607b are low-resistance regions.

Next, a method for manufacturing the transistor illustrated in FIGS. 13A to 13C is described with reference to FIGS. 7A to 7D.

First, the gate electrode 404 is formed over the substrate 100. Next, the gate insulating film 412 is formed to cover the gate electrode 404. Then, the oxide semiconductor film 606 overlapping with the gate electrode 404 with the gate insulating film 412 provided therebetween is formed (see FIG. 7A).

Next, with the use of a resist mask or the like as a mask, ions of nitrogen, phosphorus, boron, hydrogen, or a rare gas are added to part of the oxide semiconductor film 606. Only the addition of ions, or both the addition of ions and heat treatment are performed, so that the resistance of a region of the oxide semiconductor film 606 to which the ions are added is reduced, whereby the channel region 605, the source region 607a, and the drain region 607b are formed (see FIG. 7B). Note that the resist mask or the like may be formed by a back exposure technique with the use of the gate electrode 404 as a mask. In that case, an area where the source region 607a overlaps with the gate electrode 404 and an area where the drain region 607b overlaps with the gate electrode 404 can be reduced; thus, the parasitic capacitance is reduced. Accordingly, the operation speed of the transistor can be increased. In addition, the number of photomasks used for forming the resist mask can be reduced, whereby the manufacturing cost for the transistor can be reduced, which is preferable.

Figure 7A:
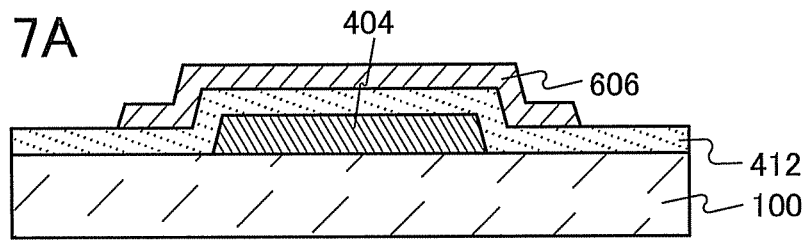
FIGS. 7A to 7D are cross-sectional views illustrating an example of a method for manufacturing a semiconductor device illustrated in FIGS. 13A to 13C.
Figure 7B:
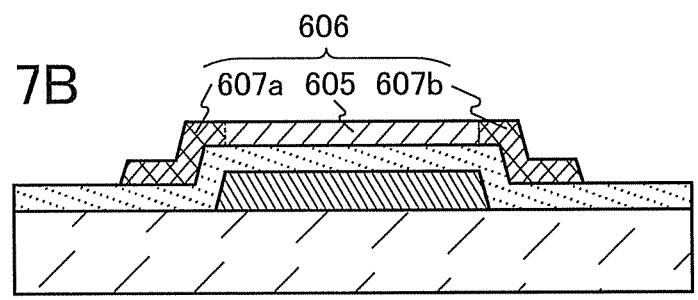
Figure 7C:
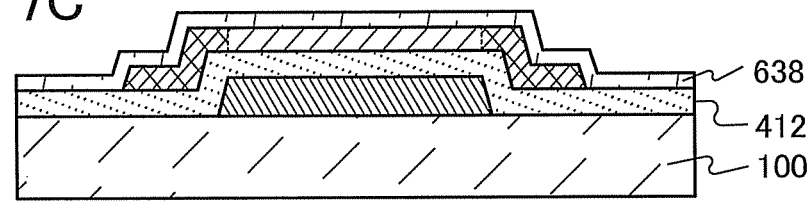
Figure 7D:
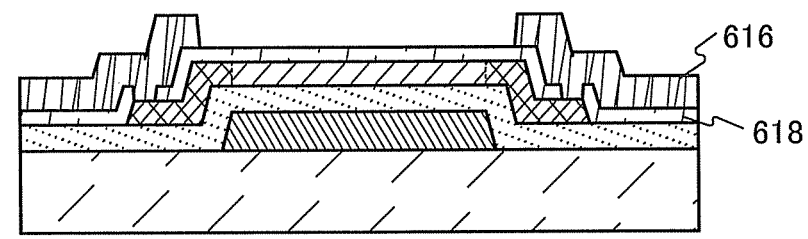

Next, a protective film 638 is formed over the oxide semiconductor film 606 and the gate insulating film 412 (see FIG. 7C). Note that the addition of ions may be performed after the formation of the protective film 638. The protective film 638 can reduce damage to the oxide semiconductor film 606 which is caused by the addition of ions.

Next, openings from which the source region 607a and the drain region 607b are exposed are formed in the protective film 638, and a conductive film is deposited. Then, the conductive film is processed to form the pair of electrodes 616 in contact with the protective film 618 and the oxide semiconductor film 606 (see FIG. 7D).

As described above, the oxide semiconductor film 606 including a crystal region having a high degree of crystallinity can be formed directly on the gate insulating film 412. Accordingly, the electron state of the interface between the gate insulating film 412 and the oxide semiconductor film 606 becomes favorable, so that a highly reliable semiconductor device having stable electric characteristics can be manufactured. Note that crystals of the source region 607a and the drain region 607b in the oxide semiconductor film 606 might be broken due to damage by the addition of ions. In the transistor according to one embodiment of the present invention, at least the channel 10, region 605 is a CAAC-OS.

Through the above steps, the transistor illustrated in FIGS. 13A to 13C can be manufactured.

This embodiment can be implemented in appropriate combination with the other embodiments.

Embodiment 2

In this embodiment, a liquid crystal display device manufactured using the transistor described in Embodiment 1 will be described. Note that an example in which one embodiment of the present invention is applied to a liquid crystal display device will be described in this embodiment; however, the present invention is not limited to this embodiment. For example, application of one embodiment of the present invention to an electroluminescence (EL) display device which is one of light-emitting devices is readily conceived by those skilled in the art.

Figure 14:
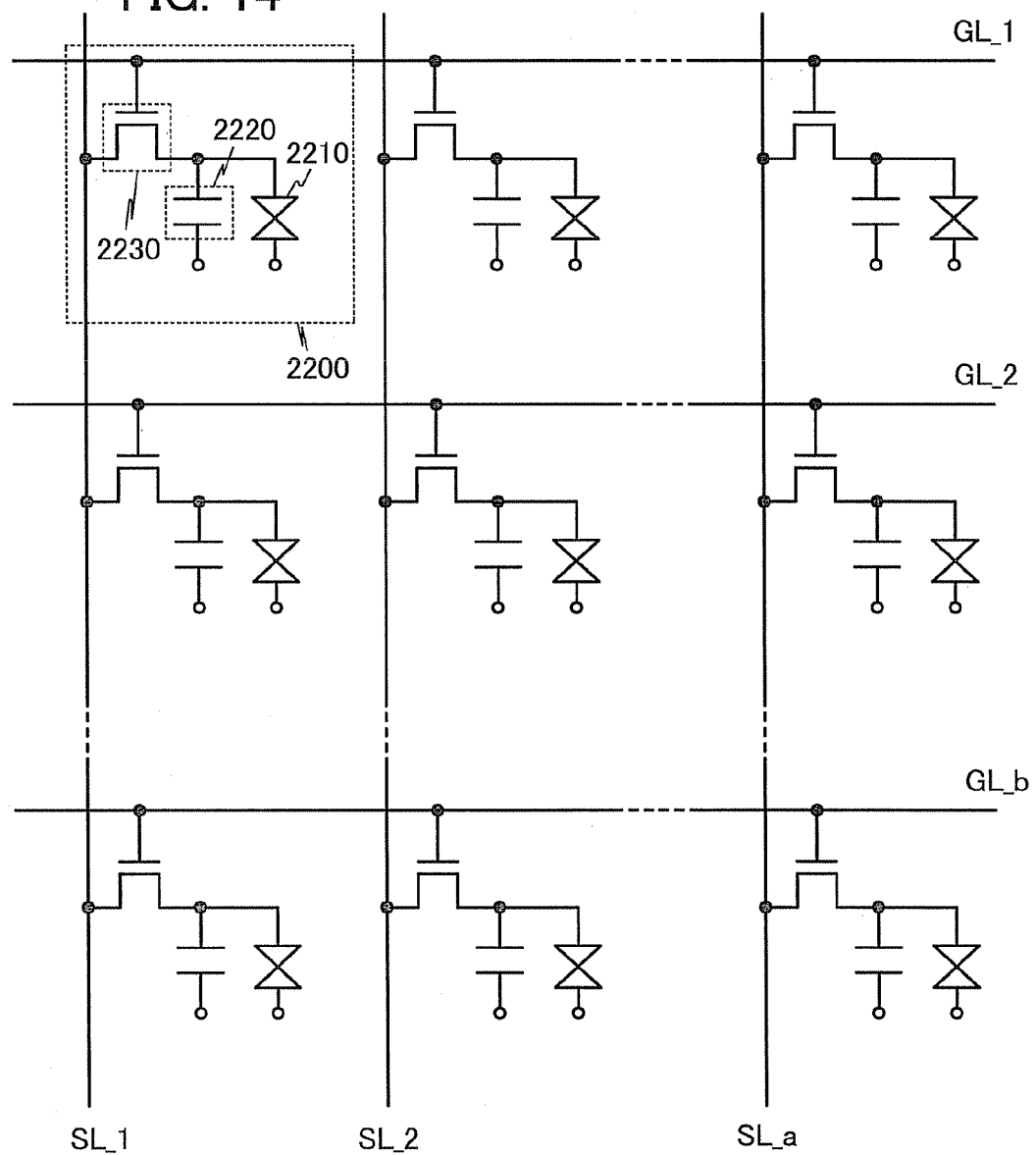
FIG. 14 is a circuit diagram illustrating an example of a liquid crystal display device according to one embodiment of the present invention.

FIG. 14 is a circuit diagram of an active matrix liquid crystal display device. The liquid crystal display device includes source lines SL_1 to SL_a, gate lines GL_1 to GL_b, and a plurality of pixels 2200. The pixels 2200 each include a transistor 2230, a capacitor 2220, and a liquid crystal element 2210. The plurality of pixels 2200 with such a structure forms a pixel portion of the liquid crystal display device. Note that a "source line SL" and a "gate line GL" simply refer to a source line and a gate line, respectively, in some cases.

The transistor described in Embodiment 1, which is one embodiment of the present invention, is used as the transistor 2230. Since the transistor described in Embodiment 1 includes an oxide semiconductor having favorable electric characteristics, a liquid crystal display device with high display quality can be obtained.

The gate line GL is connected to a gate of the transistor 2230, the source line SL is connected to a source of the transistor 2230, and a drain of the transistor 2230 is connected to one capacitor electrode of the capacitor 2220 and one pixel electrode of the liquid crystal element 2210. The other capacitor electrode of the capacitor 2220 and the other pixel electrode of the liquid crystal element 2210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 1.

The source line SL is connected to a source driver circuit. The source driver circuit may include the transistor described in Embodiment 1.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

On application of a voltage that is higher than or equal to the threshold voltage of the transistor 2230 to the gate line GL, electric charge supplied from the source line SL flows as a drain current of the transistor 2230 and is accumulated in the capacitor 2220. After charging for one row, the transistors 2230 in the row are turned off and voltage application from the source line SL stops; however, a necessary voltage can be kept by the electric charge accumulated in the capacitors 2220. Then, charging of the capacitors 2220 in the next row starts. In this manner, charging for the first row to the b-th row is carried out. A drain current is a current that flows from a drain to a source through a channel in a transistor. The drain current flows when a gate voltage is higher than the threshold voltage.

Note that in the case where a transistor whose off-state current is small is used as the transistor 2230, a time period during which the voltage is held can be longer. By this effect, the display rewriting frequency can be reduced in the case of displaying an image with little motion (including a still image); accordingly, further reduction in the power consumption is possible. Further, the capacitance of the capacitor 2220 can be further reduced; accordingly, power consumed for charging can be reduced.

In the above-described manner, according to one embodiment of the present invention, a liquid crystal display device with high display quality and low power consumption can be provided.

This embodiment can be implemented in appropriate combination with the other embodiments.

Embodiment 3

In this embodiment, an example of manufacturing a semiconductor memory device using the transistor described in Embodiment 1 will be described.

As typical examples of a volatile semiconductor memory devices, there are a dynamic random access memory (DRAM) which stores data in such a manner that a transistor included in a memory element is selected and electric charge is accumulated in a capacitor, and a static random access memory (SRAM) which retains stored data using a circuit such as a flip-flop.

Typical examples of a nonvolatile semiconductor memory device include a flash memory which has a node between a gate and a channel region of a transistor and stores data by retaining electric charge in the node.

The transistor described in Embodiment 1 can be applied to some of transistors included in the above-described semiconductor memory device.

First, a memory cell included in the semiconductor memory device to which the transistor described in Embodiment 1 is applied is described with reference to FIGS. 15A and 15B.

Figure 15A:
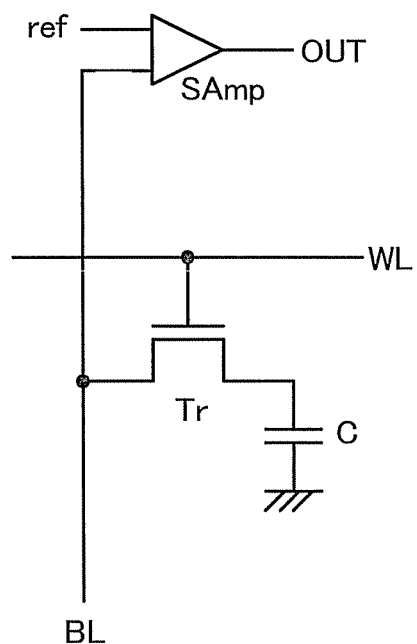
FIG. 15A is circuit diagram showing an example of a semiconductor memory device according to one embodiment of the present invention.

The memory cell includes a bit line BL, a word line WL, a sense amplifier SAmp, a transistor Tr, and a capacitor C (see FIG. 15A).

Figure 15B:
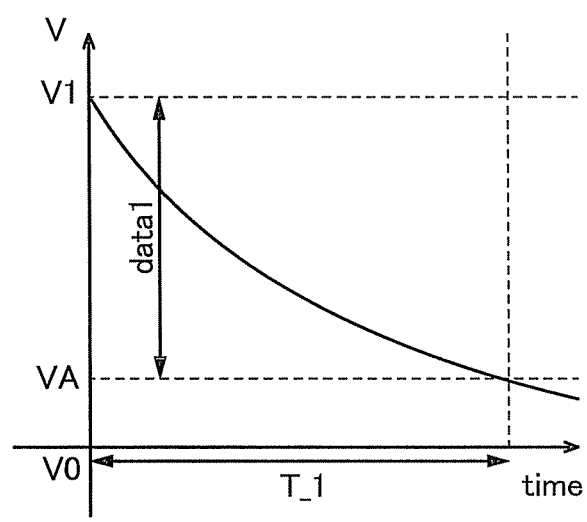
FIG. 15B shows electric characteristics thereof.

It is known that the voltage retained in the capacitor C is gradually reduced over time due to the off-state current of the transistor Tr as shown in FIG. 15B. After a certain period of time, the voltage originally charged from V0 to V1 is decreased to VA which is a limit for reading data 1. This period is called a retention period T_1. In the case of a two-level memory cell, refresh needs to be performed within the retention period T_1.

Here, when the transistor described in Embodiment 1 is used as the transistor Tr, the retention period T_1 can be increased because the off-state current of the transistor is small. That is, the frequency of the refresh operation can be reduced, which results in reduction in power consumption. For example, in the case where a memory cell is formed with use of a transistor including an oxide semiconductor film that is highly purified to have an off-state current of $1 \times 10^{-21}$ A or less, preferably $1 \times 10^{-24}$ A or less, data can be retained for several days to several tens of years without supply of electric power.

As described above, according to one embodiment of the present invention, a highly reliable DRAM with low power consumption can be obtained.

Next, a semiconductor memory device to which the transistor described in Embodiment 1 is applied is described with reference to FIGS. 16A and 16B.

Figure 16A:
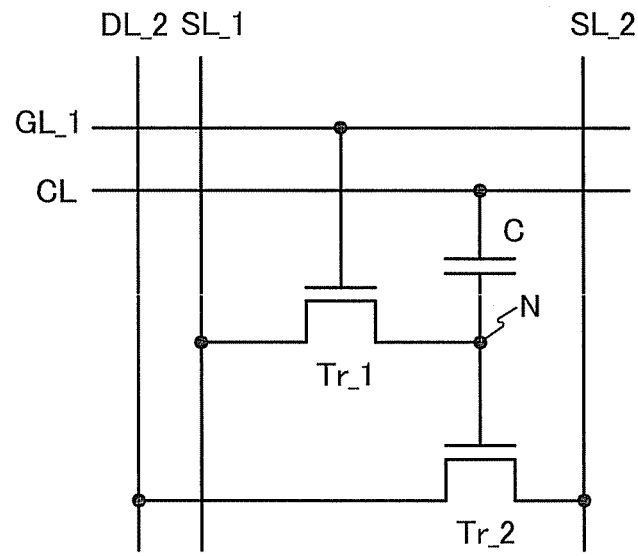
FIG. 16A is circuit diagram showing an example of a semiconductor memory device according to one embodiment of the present invention.
Figure 16B:
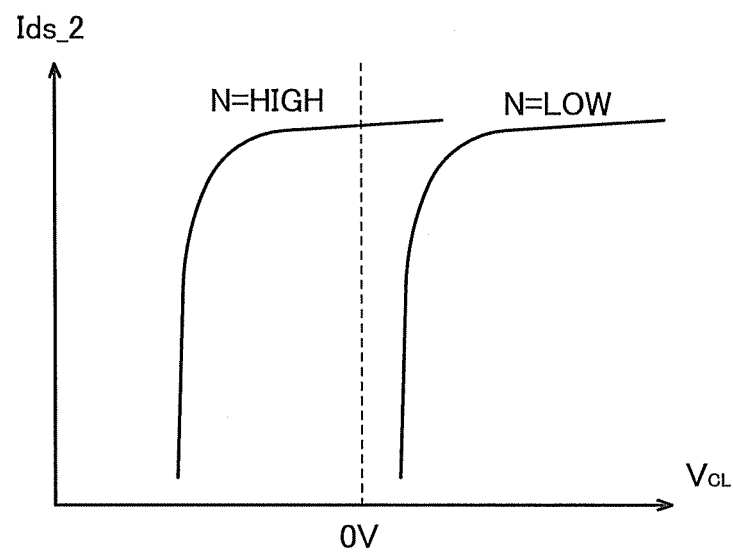
FIG. 16B shows electric characteristics thereof.

FIG. 16A is a circuit diagram of a memory cell included in the semiconductor memory device. The memory cell includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a node N connected to the other terminal of the capacitor C, a drain of the transistor Tr_1, and a gate of the transistor Tr_2.

The semiconductor memory device including the memory cell described in this embodiment utilizes change in the threshold voltage of the transistor Tr_2, which depends on the potential of the node N. For example, FIG. 16B shows a relation between a voltage $V_{CL}$ of the capacitor line CL and a drain current $I_{ds\_2}$ flowing through the transistor Tr_2.

Here, the voltage of the node N can be adjusted through the transistor Tr_1. For example, the potential of the source line SL_1 is set to VDD. In this case, when the potential of the gate line GL_1 is set to higher than or equal to a potential obtained by adding VDD to the threshold voltage Vth of the transistor Tr_1, the voltage of the node N can be HIGH. Further, when the potential of the gate line GL_1 is set to lower than or equal to the threshold voltage Vth of the transistor Tr_1, the potential of the node N can be LOW.

Thus, either a $V_{CL}$-$I_{ds\_2}$ curve (N=LOW) or a $V_{CL}$-$I_{ds\_2}$ curve (N=HIGH) can be obtained. That is, when N=LOW, $I_{ds\_2}$ is small at a $V_{CL}$ of 0 V; accordingly, data 0 is stored. Further, when N=HIGH, $I_{ds\_2}$ is large at a $V_{CL}$ of 0 V; accordingly, data 1 is stored. In this manner, data can be stored.

Here, when the transistor described in Embodiment 1 is used as the transistor Tr_1, the off-state current of the transistor can be significantly reduced; therefore, unintentional leakage of an electric charge accumulated in the node N by flowing between the source and the drain of the transistor Tr_1 can be suppressed. Therefore, data can be retained for a long period. With use of one embodiment of the present invention, the threshold voltage of the transistor Tr_1 is adjusted, which enables reduction in the voltage necessary for writing. Thus, power consumption can be made small as compared to a flash memory or the like.

Note that the transistor described in Embodiment 1 may also be applied to the transistor Tr_2.

In the above manner, according to one embodiment of the present invention, a semiconductor memory device with high reliability for a long period, low power consumption, and a high degree of integration can be obtained.

This embodiment can be implemented in appropriate combination with the other embodiments.

Embodiment 4

A central processing unit (CPU) can be formed with the use of the transistor described in Embodiment 1 or the semiconductor memory device described in Embodiment 3 for at least part of the CPU.

Figure 17A:
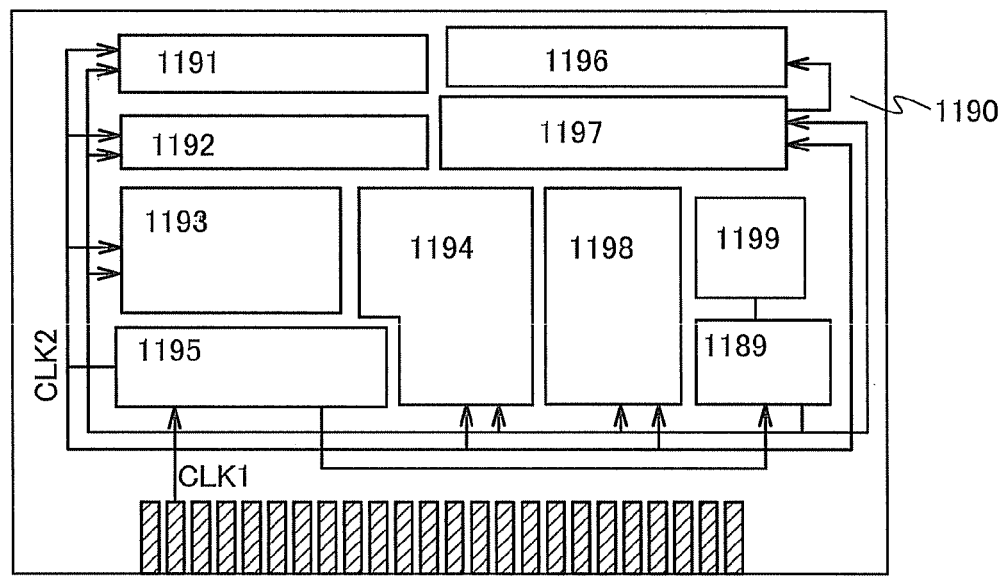
FIG. 17A is a block diagram illustrating a specific example of a CPU according to one embodiment of the present invention.

FIG. 17A is a block diagram illustrating a specific structure of the CPU. The CPU illustrated in FIG. 17A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 17A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 17A, a memory element is provided in the register 1196. As the memory element in the register 1196, for example, the semiconductor memory device described in Embodiment 3 can be used.

In the CPU illustrated in FIG. 17A, the register controller 1197 selects operation of retaining data in the register 1196 in accordance with an instruction from the ALU 1191. That is, the register controller 1197 selects whether data is retained by a flip flop or a capacitor in the memory element included in the register 1196. When data is retained by the flip flop, a power supply voltage is supplied to the memory element in the register 1196. When data is retained by the capacitor, the data in the capacitor is rewritten, and supply of the power supply voltage to the memory element in the register 1196 can be stopped.

Figure 17B:
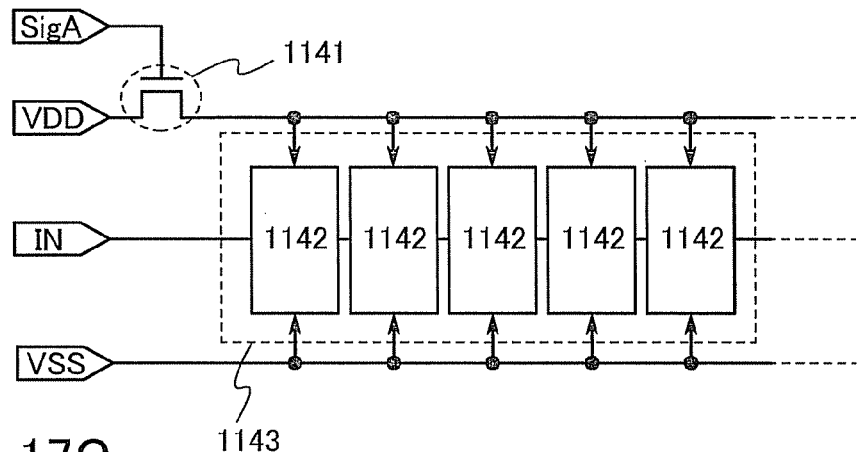
FIGS. 17B and 17C are circuit diagrams each illustrating part of the CPU.
Figure 17C:
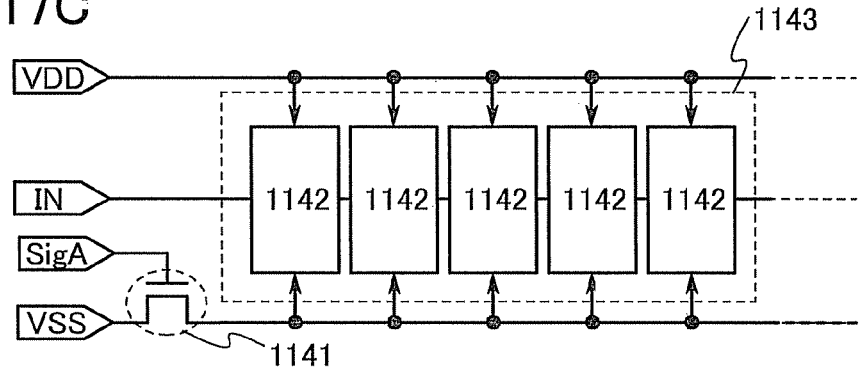

The power supply can be stopped by providing a switching element between a memory element group and a node to which a power supply potential VDD or a power supply potential VSS is supplied, as illustrated in FIG. 17B or FIG. 17C. Circuits illustrated in FIGS. 17B and 17C will be described below.

FIGS. 17B and 17C each illustrate an example of a structure including a transistor described in Embodiment 1 as a switching element for controlling supply of a power supply potential to a memory element.

The memory device illustrated in FIG. 17B includes a switching element 1141 and a memory element group 1143 including a plurality of memory elements 1142. Specifically, as each of the memory elements 1142, the memory element described in Embodiment 3 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and a potential of the low-level power supply potential VSS.

In FIG. 17B, as the switching element 1141, a transistor in which semiconductor with a wide band gap such as an oxide semiconductor is used for an active layer is used, and the switching of the transistor is controlled by a signal Sig A supplied to a gate electrode thereof.

Note that FIG. 17B illustrates the structure in which the switching element 1141 includes only one transistor; however, without limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 17C, an example of a memory device in which each of the memory elements 1142 included in the memory element group 1143 is supplied with the low-level power supply potential VSS through the switching element 1141 is illustrated.

The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where an operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with the other embodiments Embodiment 5

In this embodiment, examples of electronic devices to which any of Embodiments 1 to 4 is applied are described.

Figure 18A:
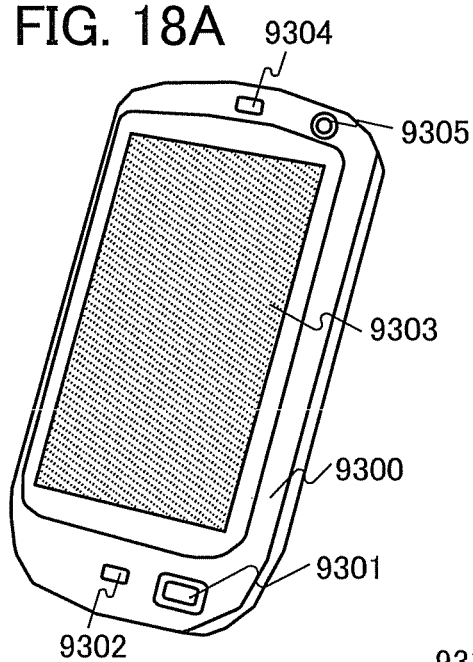
FIGS. 18A to 18C are perspective views each illustrating an example of an electronic device according to an embodiment of the present invention.

FIG. 18A illustrates a portable information terminal. The portable information terminal illustrated in FIG. 18A includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit inside the main body.

Figure 18B:
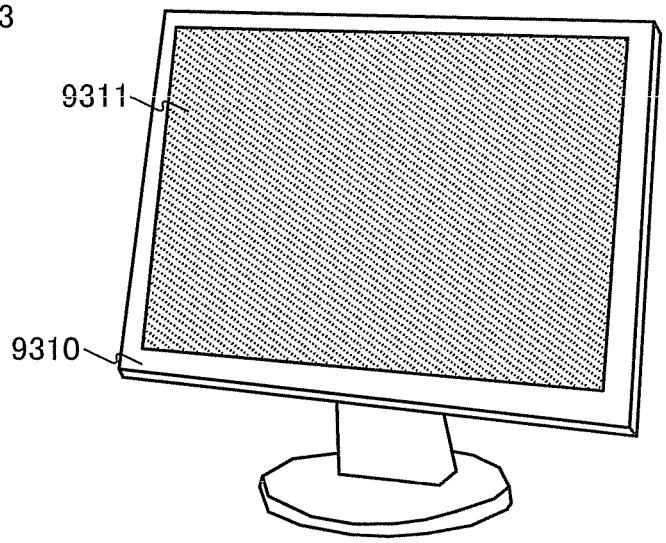

FIG. 18B illustrates a display. The display illustrated in FIG. 18B includes a housing 9310 and a display portion 9311. One embodiment of the present invention can be applied to the display portion 9311. When one embodiment of the present invention is applied, a display having high display quality can be provided even in the case where the size of the display portion 9311 is increased.

Figure 18C:
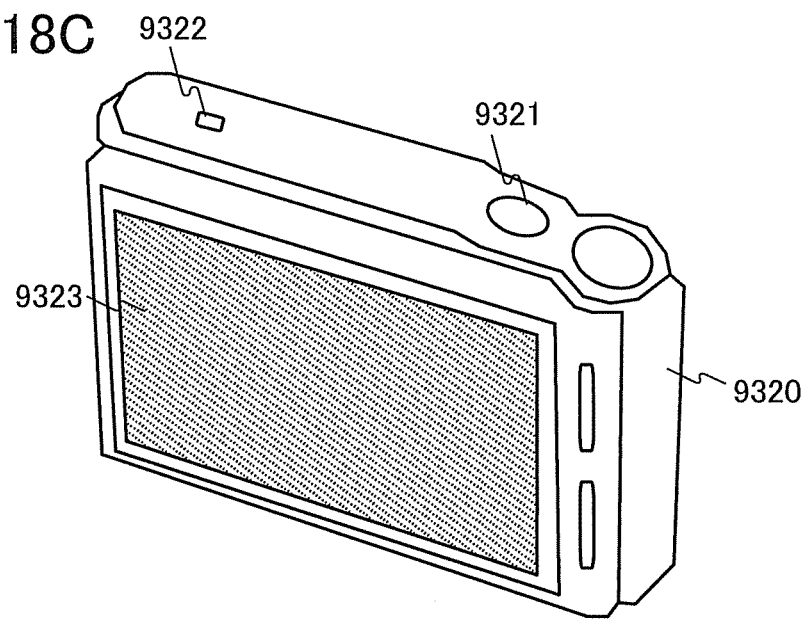

FIG. 18C illustrates a digital still camera. The digital still camera illustrated in FIG. 18C includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

When one embodiment of the present invention is applied, the performance of an electronic device can be improved and the reliability of the electronic device can be improved.

This embodiment can be implemented in appropriate combination with the other embodiments.

Example 1

In this example, evaluation results of crystal states of YSZ films used in one embodiment of the present invention are described.

The crystal state was measured by an out-of-plane method using an X-ray diffractometer D8 ADVANCE manufactured by Bruker AXS.

Six kinds of samples were prepared (Sample 1 to Sample 6). Each sample was obtained in such a manner that a YSZ film was deposited to a thickness of 100 nm over a glass substrate. The YSZ film was deposited by a sputtering method under the following conditions: a circle YSZ target with a diameter of six inches ($ZrO_2:Y_2O_3$=92:8 [molar ratio]) was used; the deposition power was set to 500 W (RF); the deposition pressure was set to 0.4 Pa; the deposition gas was argon and oxygen each flowing at a rate of 20 sccm; the T-S distance was set to 135 mm.

Tsub of each of Sample 1 to Sample 3 was set to room temperature, and Tsub of each of Sample 4 to Sample 6 was set to 300° C.

In addition, Sample 1 and Sample 4 were not subjected to heat treatment after deposition of the YSZ film. Sample 2 and Sample 5 were each subjected to heat treatment at 350° C. in a nitrogen atmosphere for one hour after the deposition of the YSZ film. Sample 3 and Sample 6 were each subjected to heat treatment at 600° C. in a nitrogen atmosphere for one hour after the deposition of the YSZ film.

Table 1 shows Tsub and the heat treatments performed on the respective samples after deposition of the YSZ film.

TABLE 1

| Sample name | Tsub | Heat treatment condition |
|---|---|---|
| Sample 1 | Room temperature | Not performed |
| Sample 2 | Room temperature | 350° C. |
| Sample 3 | Room temperature | 600° C. |
| Sample 4 | 300° C. | Not performed |
| Sample 5 | 300° C. | 350° C. |
| Sample 6 | 300° C. | 600° C. |

Figure 20:
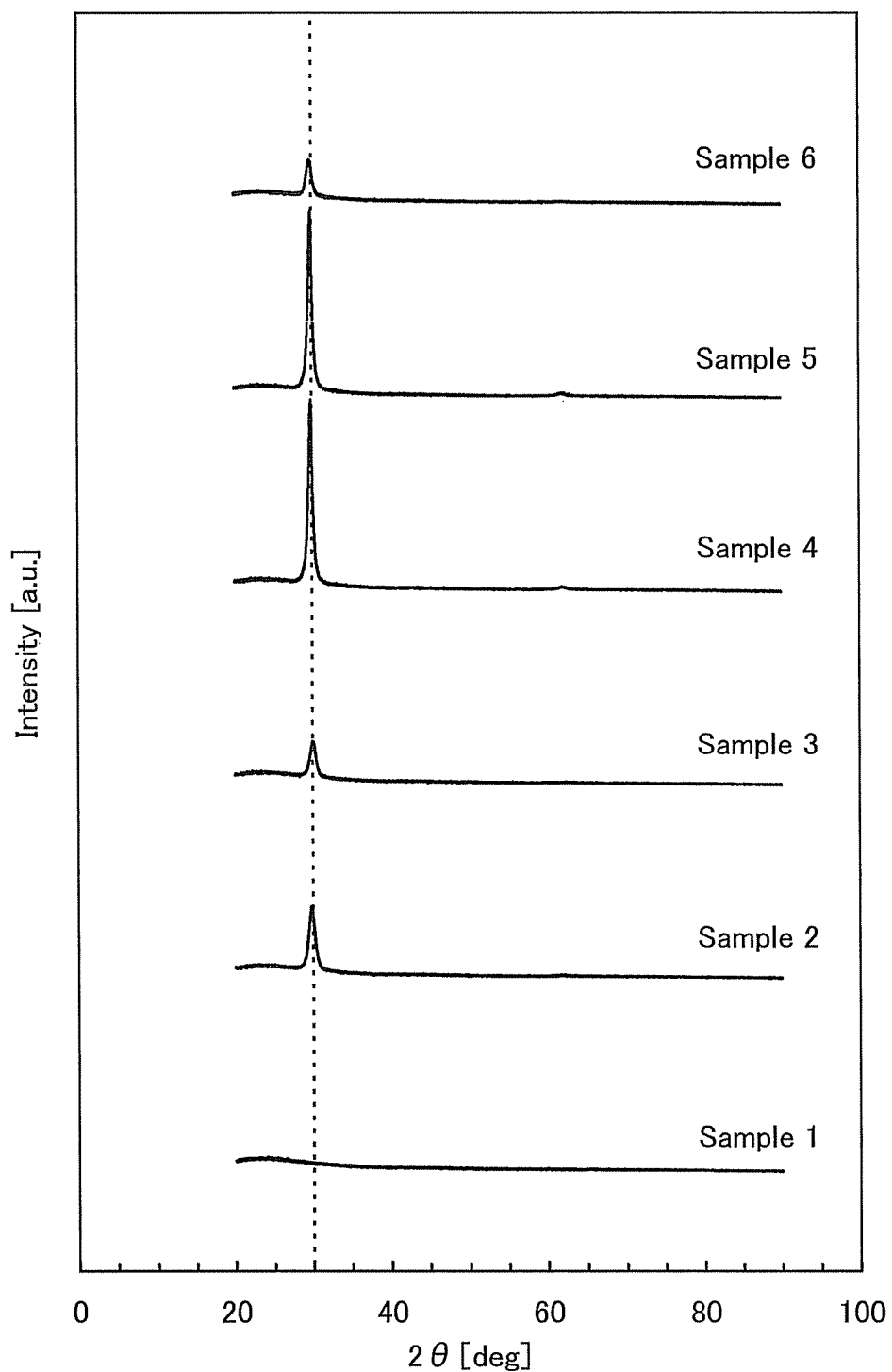
FIG. 20 shows results of XRD of YSZ films.

FIG. 20 shows XRD results of the samples. Sample 2 to Sample 6 indicate strong diffraction from the (111) plane.

When peak intensities of the samples in FIG. 20 are compared with each other, it is found that the crystallinity is not always increased when heat treatment at a high temperature is performed after deposition of the YSZ film. This fact suggests the possibility that the crystal structure of the YSZ film is broken by heat treatment at a high temperature.

Table 2 shows the peak intensity, FWHM, the lattice constant a, and the nearest neighbor interatomic distance calculated from the lattice constant a in the (111) plane of each sample. Here, the nearest neighbor interatomic distance corresponds to the length of one dotted line 7010 illustrated in FIG. 19A.

TABLE 2

| Sample name | Peak position [deg] | FWHM [deg] | Lattice constant a [nm] | Nearest neighbor interatomic distance [nm] |
|---|---|---|---|---|
| Sample 1 | — | — | — | — |
| Sample 2 | 29.736 | 0.326 | 0.5200 | 0.3677 |
| Sample 3 | 30.075 | 0.301 | 0.5142 | 0.3636 |
| Sample 4 | 29.829 | 0.549 | 0.5184 | 0.3666 |
| Sample 5 | 29.797 | 0.530 | 0.5189 | 0.3669 |
| Sample 6 | 29.733 | 0.765 | 0.5200 | 0.3677 |

Since the nearest neighbor interatomic distance is 0.36 nm to 0.37 nm, it is found that crystal growth in an oxide semiconductor film which is a CAAC-OS is easily caused over the YSZ film described in this example.

Specifically, in the case of an oxide semiconductor film having a hexagonal crystal structure with a lattice constant a of greater than or equal to 0.31 nm and less than or equal to 0.42 nm, preferably greater than or equal to 0.33 nm and less than or equal to 0.40 nm, more preferably greater than or equal to 0.34 nm and less than or equal to 0.38 nm, it is found that the oxide semiconductor film including a crystal region having a high degree of crystallinity is likely to be provided directly on the YSZ film described in this example.

This application is based on Japanese Patent Application serial no. 2011-134056 filed with Japan Patent Office on Jun. 16, 2011, the entire contents of which are hereby incorporated by reference.

What is claimed is:

1. A semiconductor device comprising:
an underlayer film over a substrate, the underlayer film containing stabilized zirconia;
an oxide semiconductor film over and in contact with the underlayer film, the oxide semiconductor film including a crystal region;
a gate insulating film over the oxide semiconductor film;
a gate electrode over the gate insulating film; and
a pair of electrodes over and in contact with the oxide semiconductor film and the underlayer film,
wherein a value obtained by dividing a difference between nearest neighbor interatomic distance of the underlayer film within an interface where the underlayer film and the oxide semiconductor film are in contact with each other and a lattice constant of the oxide semiconductor film by the nearest neighbor interatomic distance of the underlayer film within the interface is less than or equal to 0.15.

2. The semiconductor device according to claim 1, wherein the stabilized zirconia has a cubic crystal structure and (111) plane orientation.

3. The semiconductor device according to claim 1, wherein the crystal region comprises a hexagonal crystal structure and a c-axis alignment.

4. The semiconductor device according to claim 3, wherein the lattice constant of the oxide semiconductor film is a-axis lattice constant.

5. The semiconductor device according to claim 1, wherein the substrate is one of a glass substrate and a semiconductor substrate.

6. A semiconductor device comprising:
an insulating layer over a substrate, the insulating layer containing stabilized zirconia;
an oxide semiconductor layer over and in contact with the insulating layer, the oxide semiconductor layer including a crystal region; and
a pair of electrodes over and in contact with the oxide semiconductor layer and the insulating layer,
wherein orientation of the insulating layer is (111) plane on an interface where the insulating layer and the oxide semiconductor layer are in contact with each other, and
wherein a value obtained by dividing a difference between nearest neighbor interatomic distance of the insulating layer within the interface and a lattice constant of the oxide semiconductor layer by the nearest neighbor interatomic distance of the insulating layer within the interface is less than or equal to 0.15.

7. The semiconductor device according to claim 6, wherein the crystal region comprises a hexagonal crystal structure and a c-axis alignment.

8. The semiconductor device according to claim 7, wherein the lattice constant of the oxide semiconductor layer is a-axis lattice constant.

9. The semiconductor device according to claim 6, wherein the substrate is one of a glass substrate and a semiconductor substrate.

10. The semiconductor device according to claim 6, wherein the stabilized zirconia has a cubic crystal structure.

11. A semiconductor device comprising:
an insulating layer over a substrate, the insulating layer containing stabilized zirconia;
an oxide semiconductor layer over and in contact with the insulating layer, the oxide semiconductor layer including a crystal region; and
a pair of electrodes over and in contact with the oxide semiconductor layer and the insulating layer,
wherein a value obtained by dividing a difference between nearest neighbor interatomic distance of the insulating layer within an interface where the insulating layer and the oxide semiconductor layer are in contact with each other and a lattice constant of the oxide semiconductor layer by the nearest neighbor interatomic distance of the insulating layer within the interface is less than or equal to 0.15.

12. The semiconductor device according to claim 11, wherein the stabilized zirconia has a cubic crystal structure and (111) plane orientation.

13. The semiconductor device according to claim 11, wherein the crystal region comprises a hexagonal crystal structure and a c-axis alignment.

14. The semiconductor device according to claim 13, wherein the lattice constant of the oxide semiconductor layer is a-axis lattice constant.

15. The semiconductor device according to claim 11, wherein the substrate is one of a glass substrate and a semiconductor substrate.

* * * * *

UNITED STATES PATENT AND TRADEMARK OFFICE
CERTIFICATE OF CORRECTION

PATENT NO. : 8,766,329 B2
APPLICATION NO. : 13/523262
DATED : July 1, 2014
INVENTOR(S) : Endo et al.

It is certified that error appears in the above-identified patent and that said Letters Patent is hereby corrected as shown below:

In the Specification:

Column 2, Line 16; delete "underlayer, film.", insert --underlayer film.--.

Column 4, Line 38; delete "$V_g$,", insert --$V_{gs}$--.

Column 8, Line 56; delete "atoms", insert --0 atoms--.

Column 11, Line 55; delete "Specifically;", insert --Specifically,--.

Column 12, Line 53; delete "with, reference", insert --with reference--.

Column 13, Line 51; delete "$1/V_g$,", insert --$1/V_{gs}$--.

Column 14, Line 2; delete "p of", insert --$\mu$ of--.

Column 14, Line 22; delete "1 is", insert --I is--.

Column 15, Line 52; delete "mobility was", insert --mobility $\mu$ was--.

Column 15, Line 58; delete "$V_g$,", insert --$V_{gs}$--.

Column 16, Line 30; delete "1 $nMO_3(ZnO)_m$", insert --$InMO_3(ZnO)_m$--.

Column 16, Line 54; delete "addition;", insert --addition,--.

Column 17, Line 52; delete "IDS", insert --TDS--.

Column 18, Line 11; delete "Sm", insert --$S_{H2}$--.

Column 24, Line 5; delete "Banned", insert --formed--.

Column 29, Line 30; delete "the channel 10, region", insert --the channel region--.

Column 33, Line 37; delete "which semiconductor", insert --which a semiconductor--.

Signed and Sealed this
Eleventh Day of November, 2014

Michelle K. Lee
*Deputy Director of the United States Patent and Trademark Office*